United States Patent
Morgan et al.

(10) Patent No.: US 9,256,018 B2
(45) Date of Patent: Feb. 9, 2016

(54) STIMULATED EMISSION LUMINESCENT LIGHT-GUIDE SOLAR CONCENTRATORS

(75) Inventors: John Paul Morgan, Toronto (CA); Phillip M. Chang, Scarborough (CA); Stefan H. S. Myrskog, Richmond Hill (CA)

(73) Assignee: MORGAN SOLAR INC., Toronto (CA)

( * ) Notice: Subject to any disclaimer, the term of this patent is extended or adjusted under 35 U.S.C. 154(b) by 198 days.

(21) Appl. No.: 13/063,847

(22) PCT Filed: Mar. 12, 2010

(86) PCT No.: PCT/CA2010/000363
§ 371 (c)(1),
(2), (4) Date: Jun. 1, 2011

(87) PCT Pub. No.: WO2010/102408
PCT Pub. Date: Sep. 16, 2010

(65) Prior Publication Data
US 2011/0226331 A1 Sep. 22, 2011

Related U.S. Application Data

(60) Provisional application No. 61/298,460, filed on Jan. 26, 2010.

(30) Foreign Application Priority Data

Mar. 12, 2009 (CA) ..................................... 2658193

(51) Int. Cl.
*H01L 31/055* (2014.01)
*H02S 40/22* (2014.01)
(Continued)

(52) U.S. Cl.
CPC ............ *G02B 6/0003* (2013.01); *H01L 31/055* (2013.01); *H01L 31/0547* (2014.12);
(Continued)

(58) Field of Classification Search
CPC ............ H01L 31/055; H01L 31/02322; H01L 31/054; G02B 19/0042; F24J 2/065; F24J 2/067

USPC .................................................. 136/244–265
See application file for complete search history.

(56) References Cited

U.S. PATENT DOCUMENTS 3,426,212 A   2/1969 Klaas
3,484,607 A   12/1969 McGuire et al.
(Continued)

FOREIGN PATENT DOCUMENTS

CN   101951189 A   1/2001
CN   102142892 A   8/2001
(Continued)

OTHER PUBLICATIONS

PCT International Patent Application No. PCT/CA2010/000363, International Search Report dated Jun. 16, 2010.
(Continued)

*Primary Examiner* — Jonathan Johnson
*Assistant Examiner* — Andrew Golden
(74) *Attorney, Agent, or Firm* — BCF LLP

(57) ABSTRACT

A solar concentrator comprising: A luminescent layer having luminescent particles capable of becoming excited by absorbing solar light of a first absorption frequency and, once excited, being capable of being stimulated to emit luminescent light at a first emission frequency. A light source for generating a pump light of the first emission frequency for stimulating the excited luminescent particles having absorbed solar light such that when the pump light traveling in a direction of travel stimulates the luminescent particles having absorbed solar light at the first absorption frequency the luminescent particles emit luminescent light at the first emission frequency in the direction of travel of the pump light, intensifying the pump light. A light guide adjacent to and optically coupled with the luminescent layer, the light-guide for assisting in guiding the intensified pump light via total internal reflection to a light collection area.

16 Claims, 26 Drawing Sheets

(51) Int. Cl.
*F21V 8/00* (2006.01)
*H01L 31/054* (2014.01)
*H01S 3/0915* (2006.01)
*H01S 3/16* (2006.01)
*H01S 3/17* (2006.01)
*H01S 3/23* (2006.01)

(52) U.S. Cl.
CPC .............. *G02B6/0028* (2013.01); *G02B 6/0035* (2013.01); *G02B 6/0078* (2013.01); *H01S 3/0915* (2013.01); *H01S 3/168* (2013.01); *H01S 3/1636* (2013.01); *H01S 3/17* (2013.01); *H01S 3/2308* (2013.01); *H01S 3/2358* (2013.01); *Y02B 10/12* (2013.01); *Y02E 10/52* (2013.01)

(56) References Cited

U.S. PATENT DOCUMENTS

| | | | |
|---|---|---|---|
| 3,732,505 A | | 5/1973 | Freedman |
| 3,929,510 A | | 12/1975 | Kittl |
| 4,001,704 A | * | 1/1977 | Danielmeyer et al. ......... 136/259 |
| 4,140,979 A | | 2/1979 | Ramer |
| 4,146,790 A | | 3/1979 | Goetzberger et al. |
| 4,149,902 A | | 4/1979 | Mauer et al. |
| 4,186,033 A | | 1/1980 | Boling et al. |
| 4,193,819 A | * | 3/1980 | Wohlmut ...................... 136/247 |
| 4,262,206 A | | 4/1981 | Viehmann |
| 4,268,709 A | | 5/1981 | Boling |
| 4,281,294 A | | 7/1981 | Volkin |
| 4,292,959 A | | 10/1981 | Coburn |
| 4,357,704 A | | 11/1982 | Koechner |
| 4,425,907 A | | 1/1984 | Younghouse |
| 4,488,047 A | | 12/1984 | Thomas |
| 4,799,748 A | | 1/1989 | Brown |
| 5,095,487 A | | 3/1992 | Meyerhofer et al. |
| 5,422,907 A | | 6/1995 | Bhargava |
| 5,431,742 A | | 7/1995 | Kleinerman |
| 5,575,860 A | * | 11/1996 | Cherney ........................ 136/245 |
| 5,978,407 A | | 11/1999 | Chang et al. |
| 6,476,312 B1 | | 11/2002 | Barnham |
| 6,744,960 B2 | | 6/2004 | Pelka |
| 7,417,789 B2 | | 8/2008 | Chi |
| 8,152,339 B2 | | 4/2012 | Morgan |
| 2006/0016448 A1 | | 1/2006 | Ho |
| 2007/0295383 A1 | | 12/2007 | Li et al. |
| 2008/0149165 A1 | | 6/2008 | Hoeks et al. |
| 2008/0223438 A1 | | 9/2008 | Xiang et al. |
| 2008/0271776 A1 | * | 11/2008 | Morgan ........................ 136/246 |
| 2009/0032083 A1 | | 2/2009 | Torrance et al. |
| 2009/0044861 A1 | | 2/2009 | Debije et al. |
| 2009/0095341 A1 | | 4/2009 | Pfenninger et al. |
| 2009/0157329 A1 | | 6/2009 | Weightman et al. |
| 2009/0199893 A1 | | 8/2009 | Bita et al. |
| 2009/0277494 A1 | | 11/2009 | Mazzer et al. |
| 2010/0126577 A1 | | 5/2010 | Wu et al. |
| 2010/0139749 A1 | | 6/2010 | Mapel |
| 2010/0139769 A1 | | 6/2010 | Mapel |
| 2010/0180932 A1 | | 7/2010 | Wang et al. |
| 2010/0193011 A1 | | 8/2010 | Mapel et al. |
| 2010/0307584 A1 | | 12/2010 | Goldschmidt et al. |
| 2010/0316331 A1 | | 12/2010 | Kenney et al. |
| 2011/0168236 A1 | | 7/2011 | Chan et al. |
| 2011/0253197 A1 | | 10/2011 | Mapel et al. |
| 2012/0031466 A1 | | 2/2012 | Bruer |
| 2012/0038841 A1 | | 2/2012 | Taheri |

FOREIGN PATENT DOCUMENTS

| | | |
|---|---|---|
| CN | 102237430 A | 11/2001 |
| DE | 2737847 A1 | 3/1979 |
| DE | 3007543 A1 | 9/1981 |
| DE | 102009019940 A1 | 11/2010 |
| EP | 2056361 A1 | 5/2009 |
| JP | 2003526190 A | 9/2003 |
| WO | 0166997 A2 | 9/2001 |
| WO | WO03/009012 A2 | 1/2003 |
| WO | WO2006/088369 A2 | 8/2006 |
| WO | WO2006-088370 A2 | 8/2006 |
| WO | WO2007/045917 A2 | 4/2007 |
| WO | 2008157621 A2 | 12/2008 |
| WO | 2009002943 A2 | 12/2008 |
| WO | WO2009/067479 A2 | 5/2009 |
| WO | WO2009/141295 A1 | 11/2009 |
| WO | WO2010/045634 A2 | 4/2010 |
| WO | WO2010/048484 A2 | 4/2010 |
| WO | WO2010/067296 A1 | 6/2010 |
| WO | WO2010/076791 A2 | 7/2010 |
| WO | 2011012545 A1 | 2/2011 |

OTHER PUBLICATIONS

Mapel, J.: "Organic Photovoltaics and Concentrators", Jun. 2008, 169p.
Luque, A. et al.:"Fullspectrum: a new PV wave making more efficient use of the solar spectrum", Solar Energy Materials & Solar Cells, 87, 2005, pp. 467-479.
Mayr, T. et al.: "A planar waveguide optical sensor employing simple light coupling", Analyst, The Royal Society of Chemistry, 2009, 134, pp. 1544-1547.
Barnham, K. et al.: "Nanoscale energy conversion in the quantum well solar cell", [http://www.authorstream.com/Presentation/Urban-45575-Barnham-Nanoscale-Energy-Conversion-Quantum-Solar-Cell-Outline-efficiency-versus-or-Eg-Ga-as-Education-ppt-powerpoint/].
Jones-Bey, H.: "Optical modeling determines luminescent solar-concentrator efficiency", Laser Focus World, Feb. 2009, pp. 20-22.
Sark W. et al.: "Luminescent Solar Concentrators—A review of recent results", Optics Express, vol. 16, No. 26, Dec. 22, 2008, 20p.
Supplementary Search Report from EP 10750294; May 7, 2013; Oscar Chao.
English translation of abstract of JP2003526190; retrieved from Espacenet on Jul. 7, 2015.
Rubenchik A.M. et al.: "Solar Pumped Laser Microthruster", Feb. 17, 2010; Lawrence Livermore National Laboratory; HPLA 2010, Santa Fe, NM, United States, Apr. 18, 2010 through Apr. 22, 2010.
Landis, Geoffrey A.: "Prospects for Solar Pumped Semiconductor Lasers"; Paper SPIE 2121-09, Laser Power Beaming, SPIE Proceedings vol. 2121, pp. 58-65 (1994); pp. 1-11.
English translation of abstract of DE102009019940; retrieved from Espacenet on Jul. 7, 2015.
English translation of abstract of CN101951189; retrieved from Espacenet on Jul. 7, 2015.
English translation of abstract of CN102142892; retrieved from Espacenet on Jul. 7, 2015.
English translation of abstract of CN102237430; retrieved from Espacenet on Jul. 7, 2015.

* cited by examiner

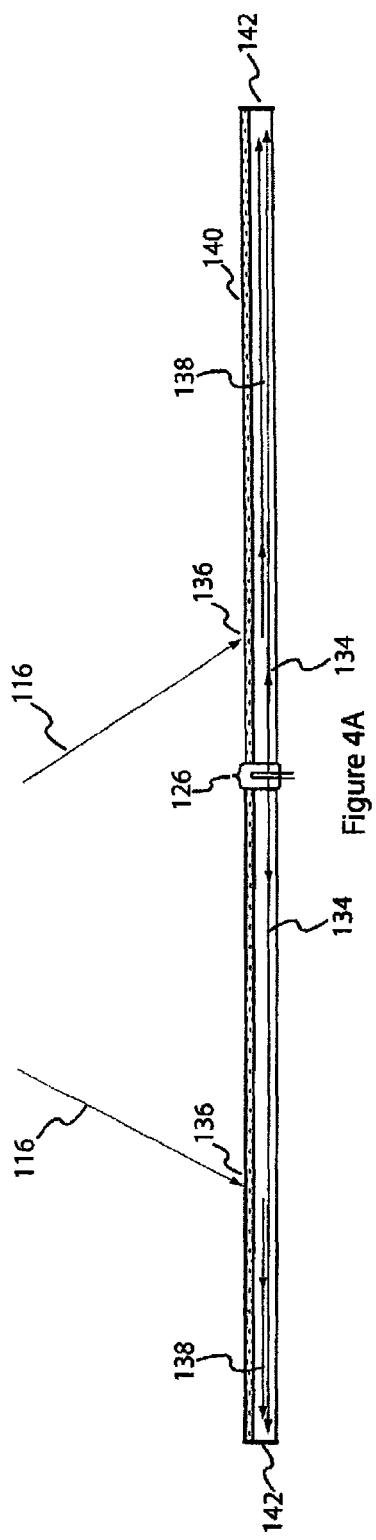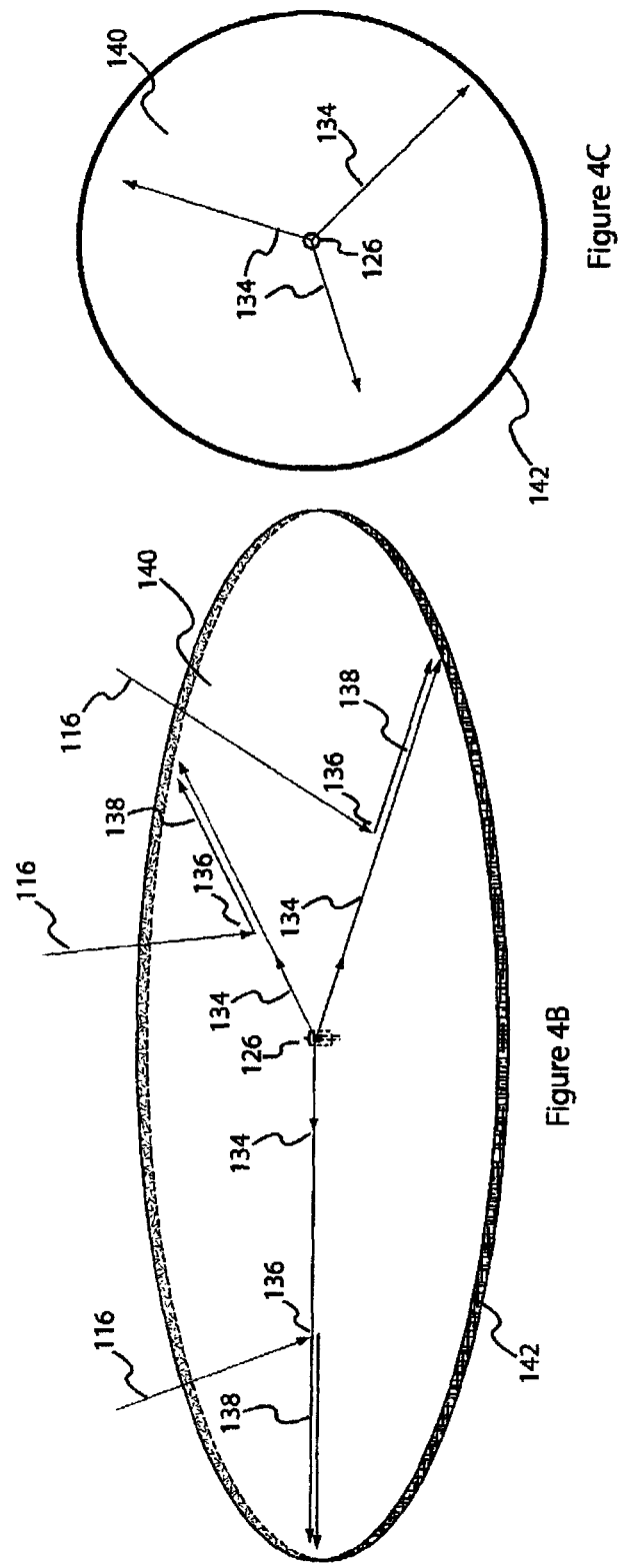

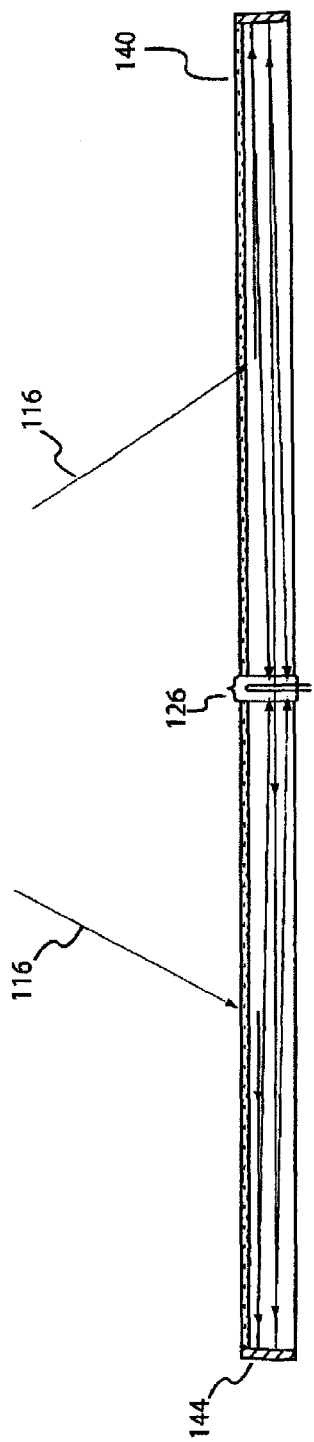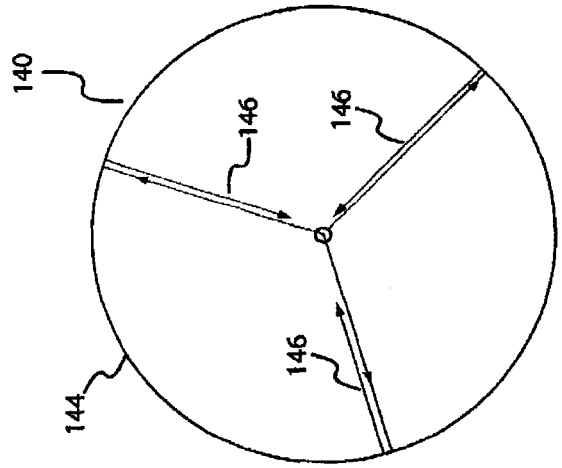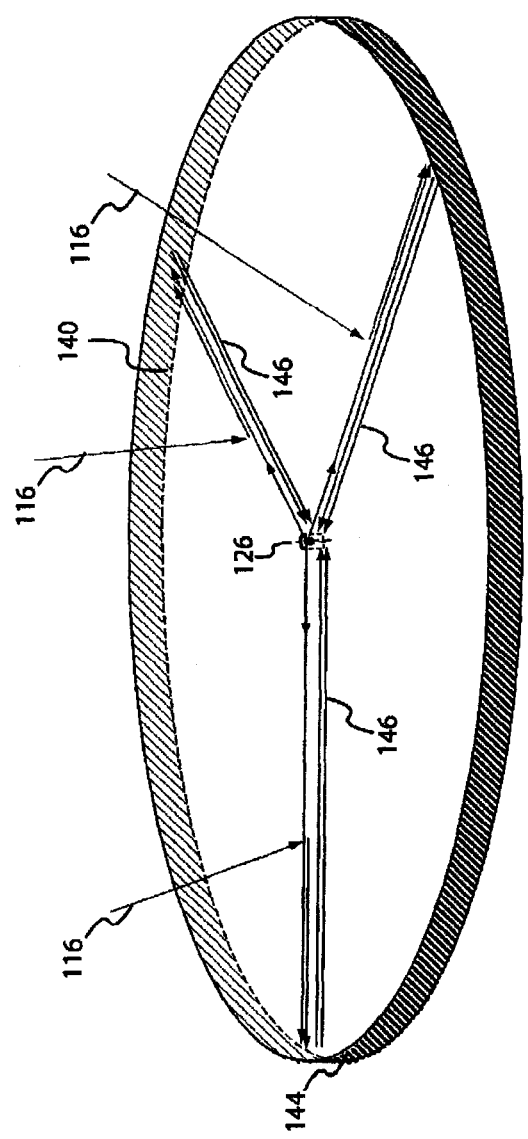

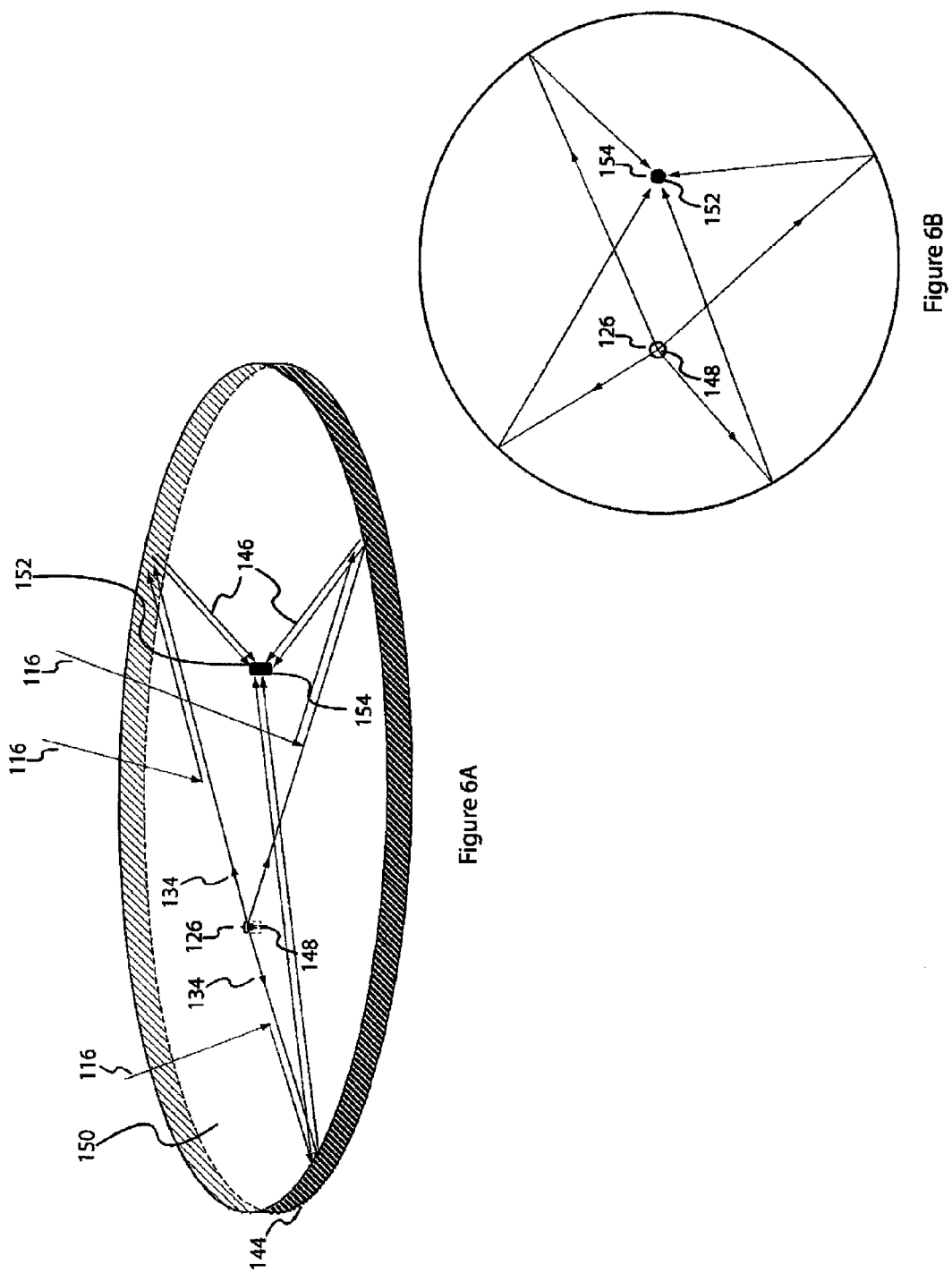

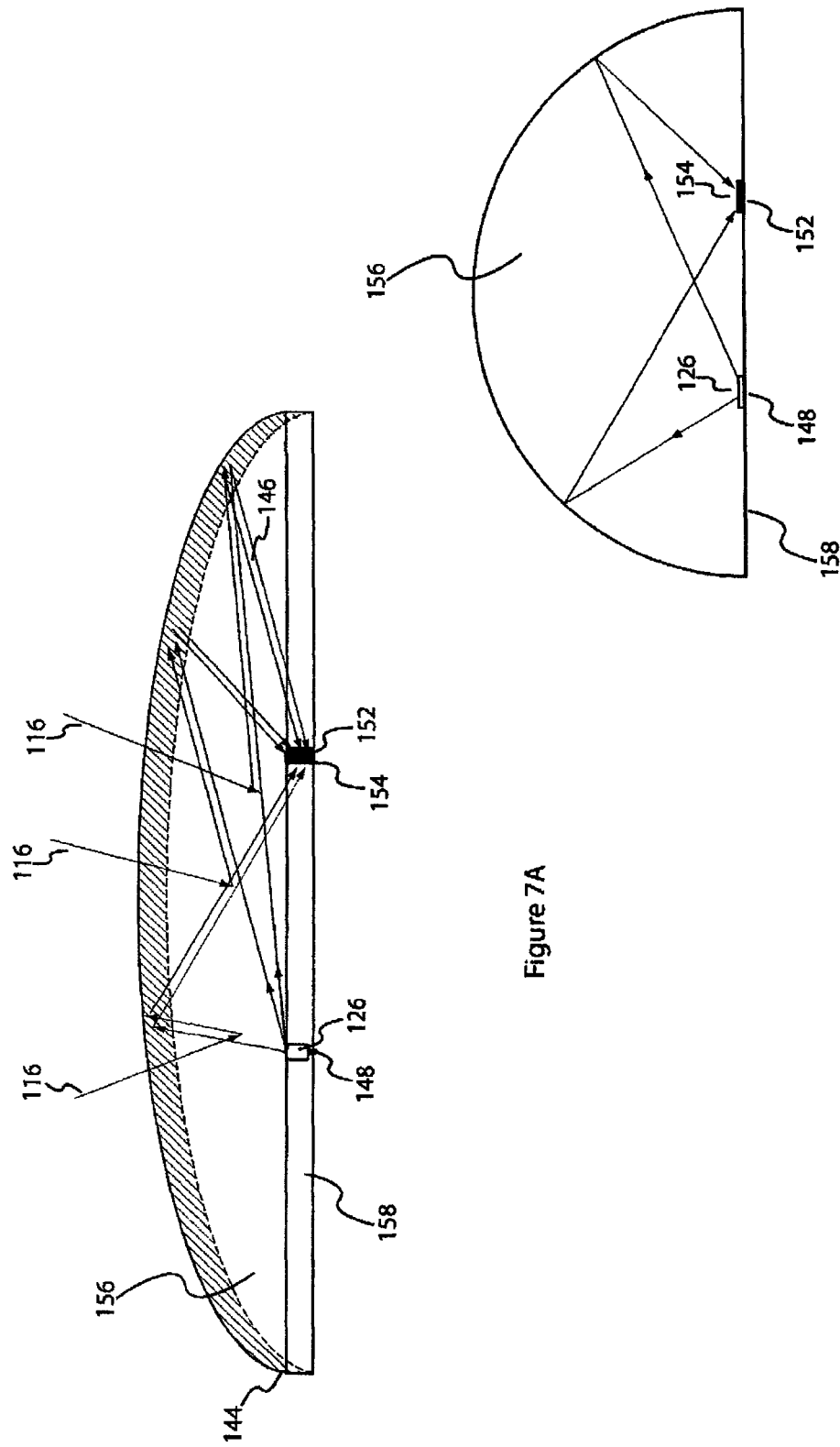

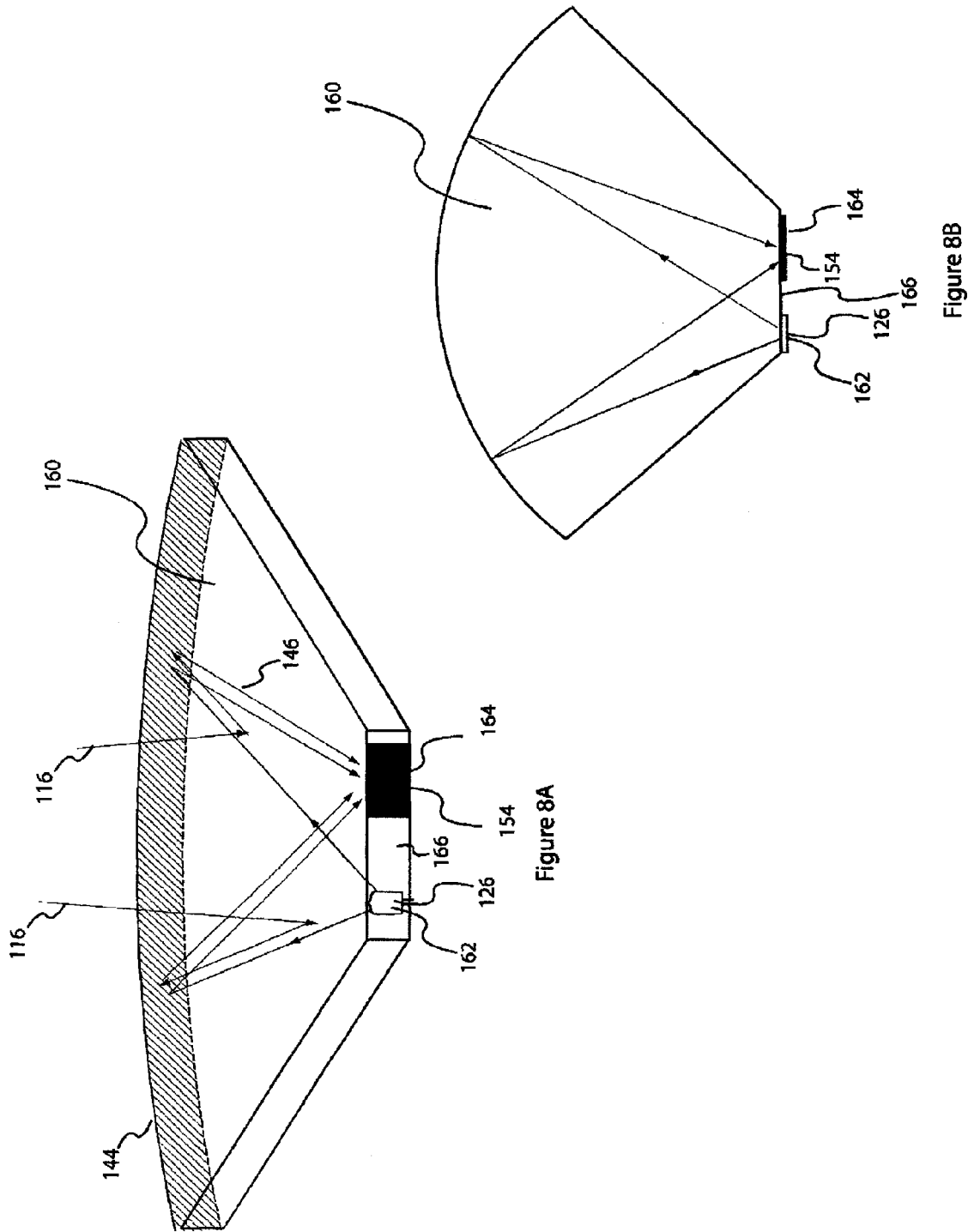

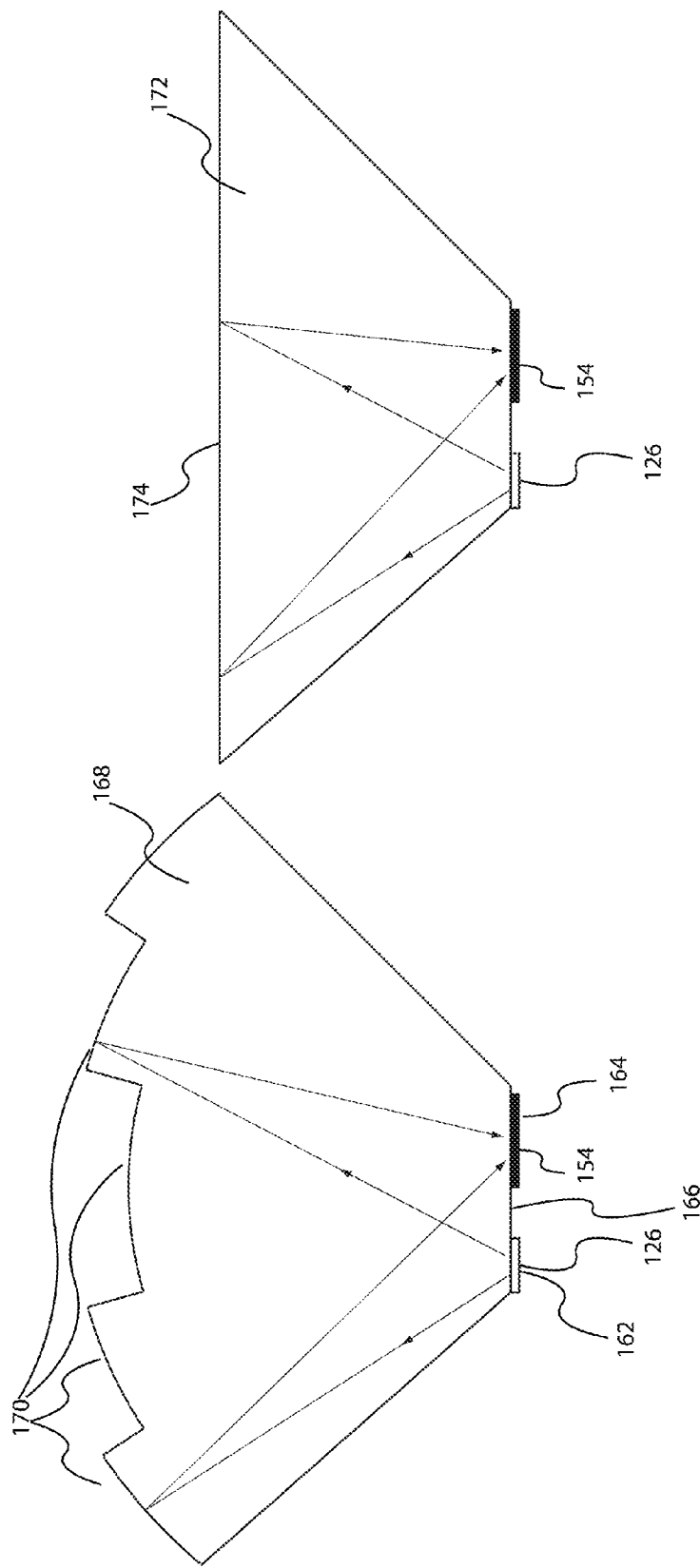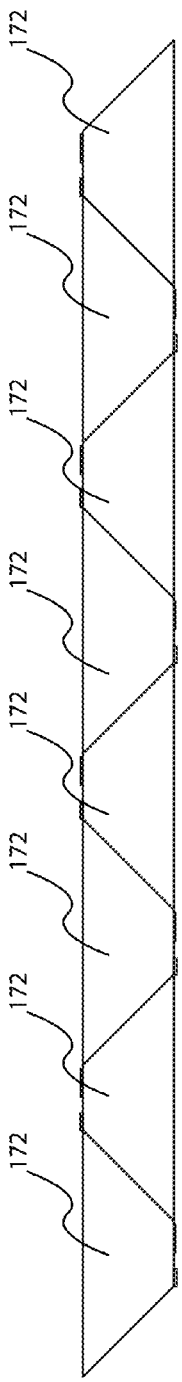
Figure 9A
Figure 9B
Figure 9C

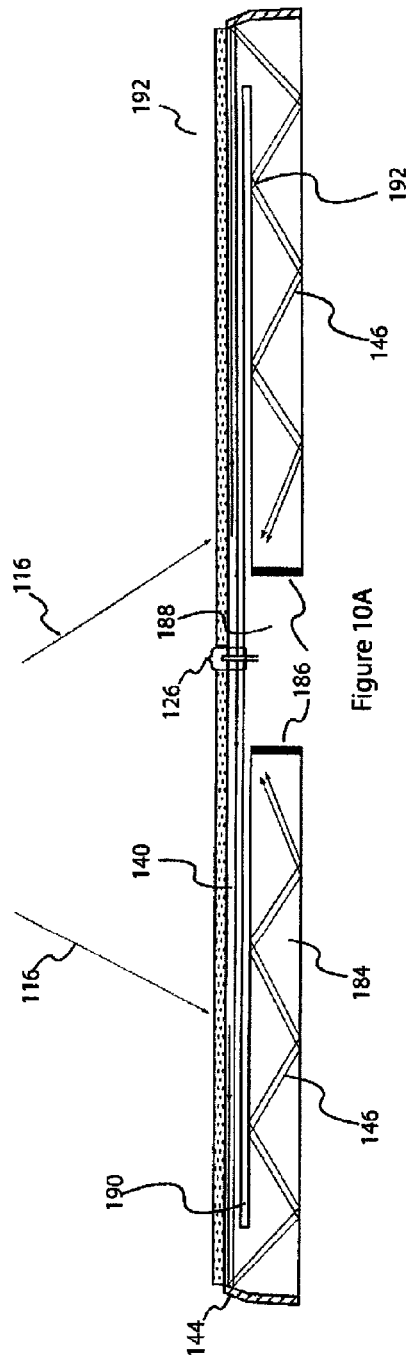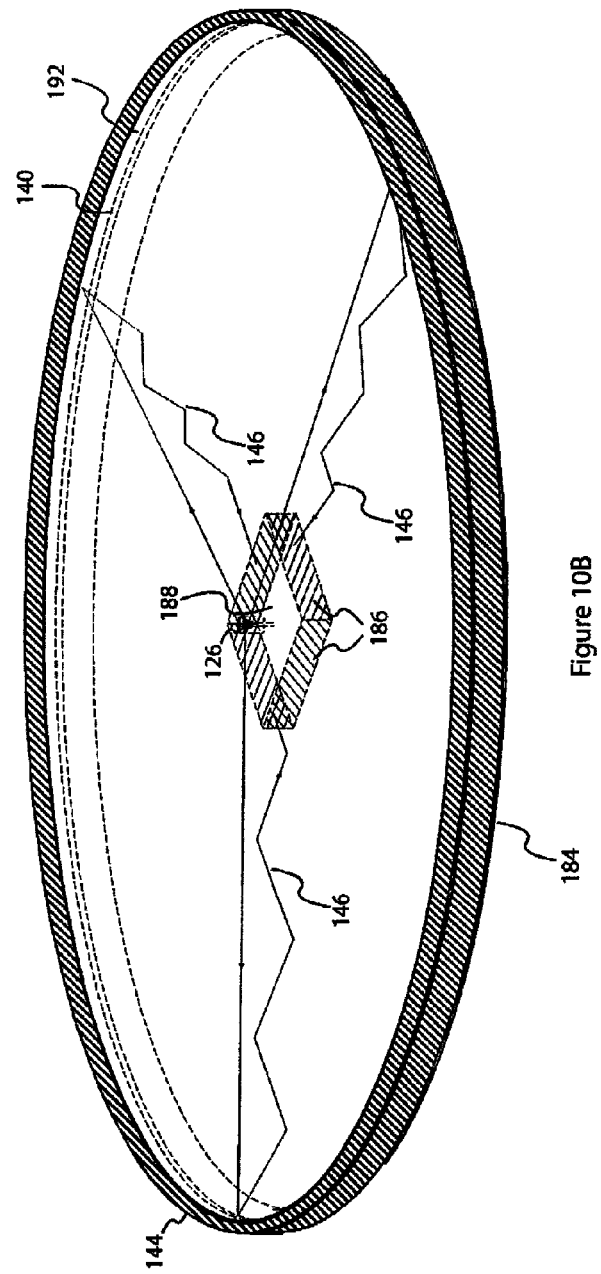

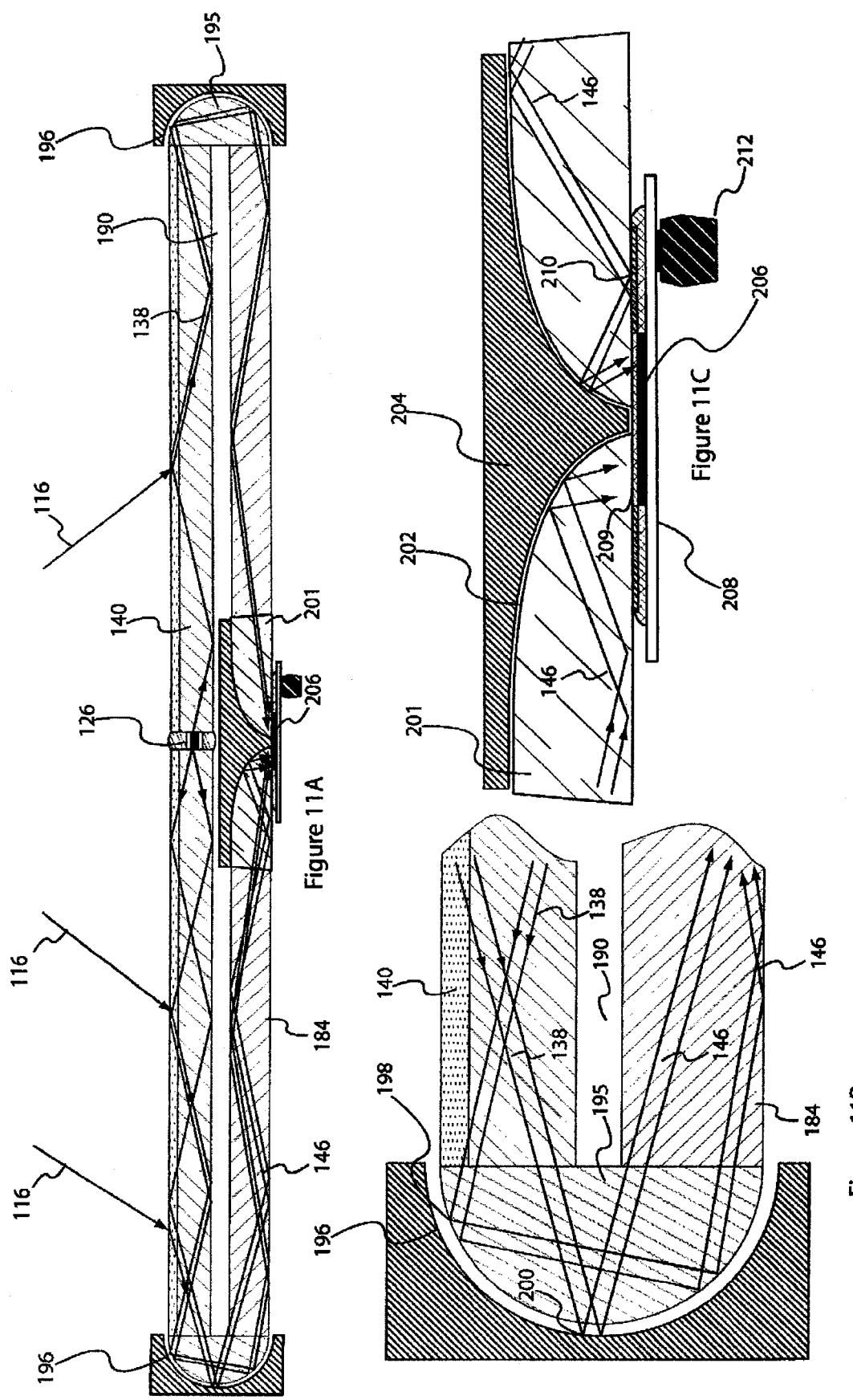

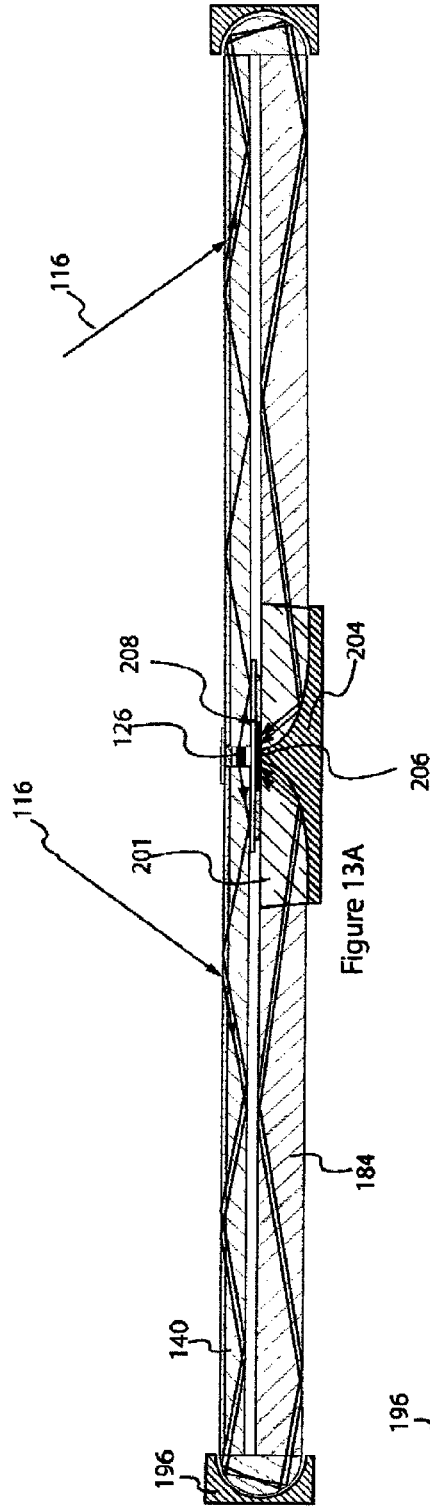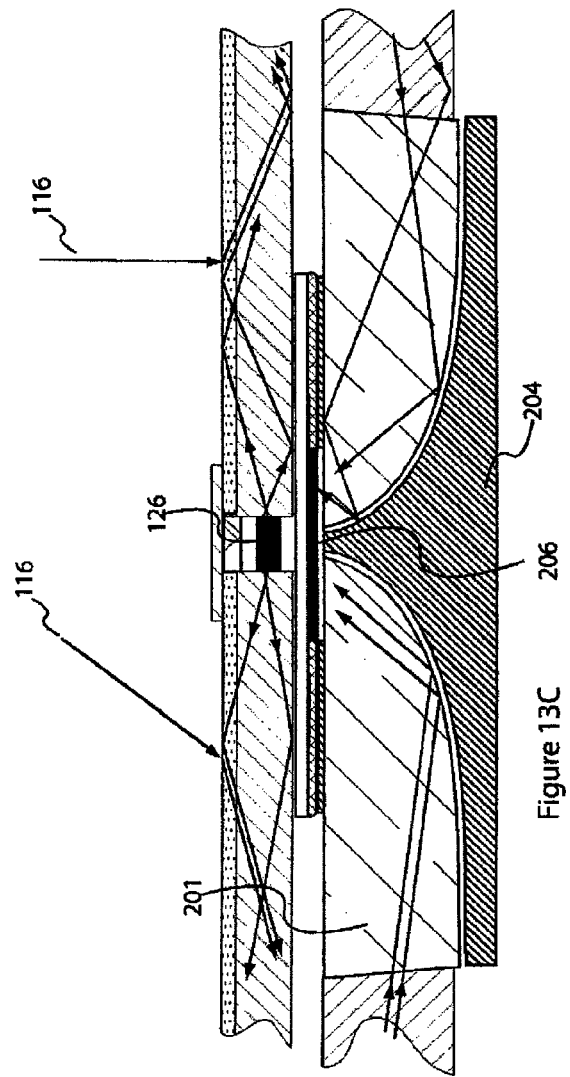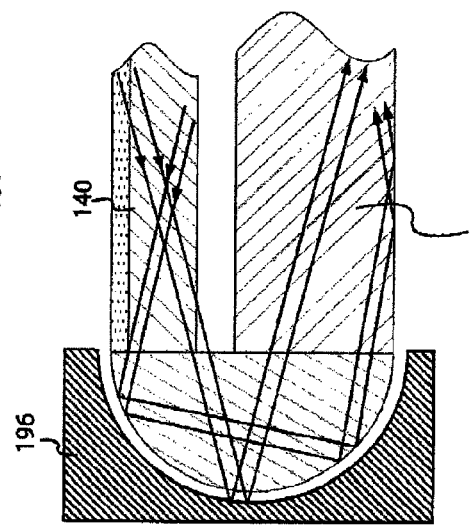

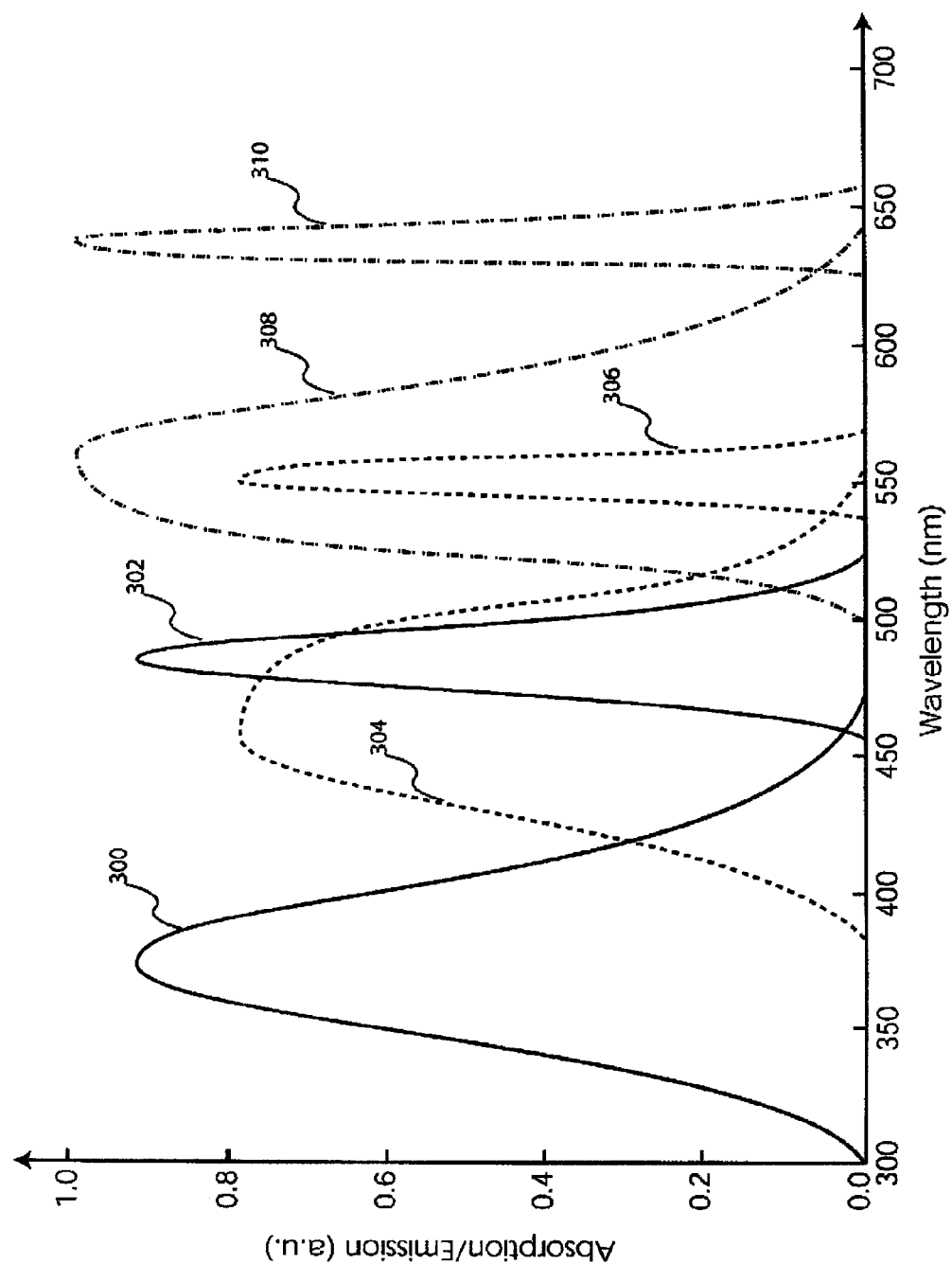

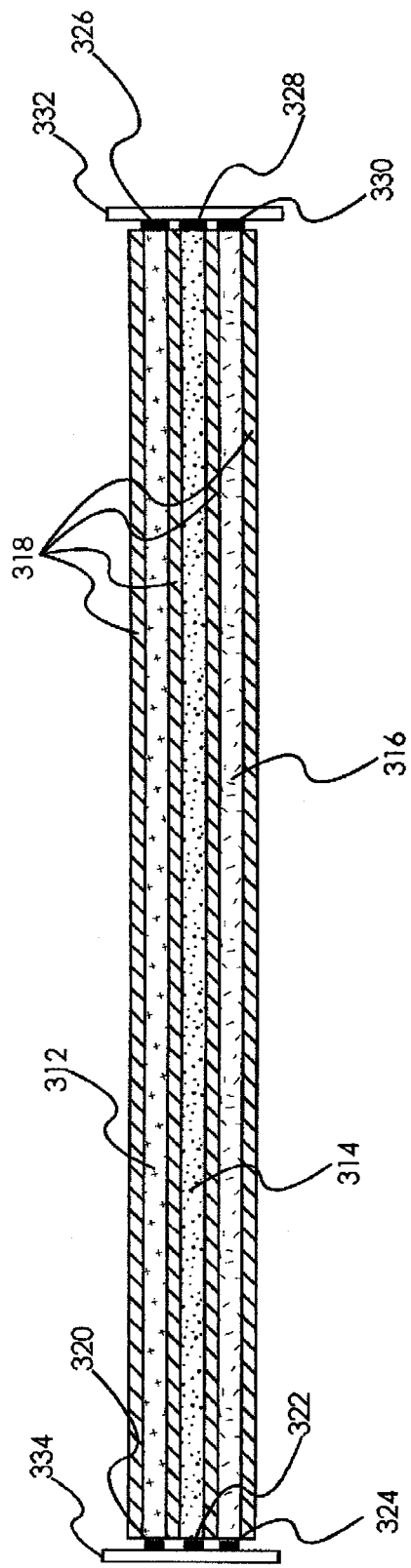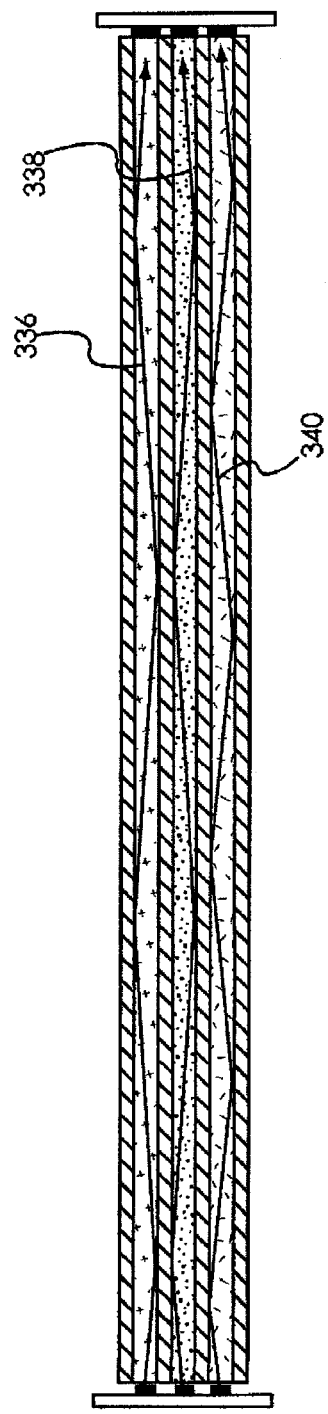
Fig. 20a
Fig. 20b

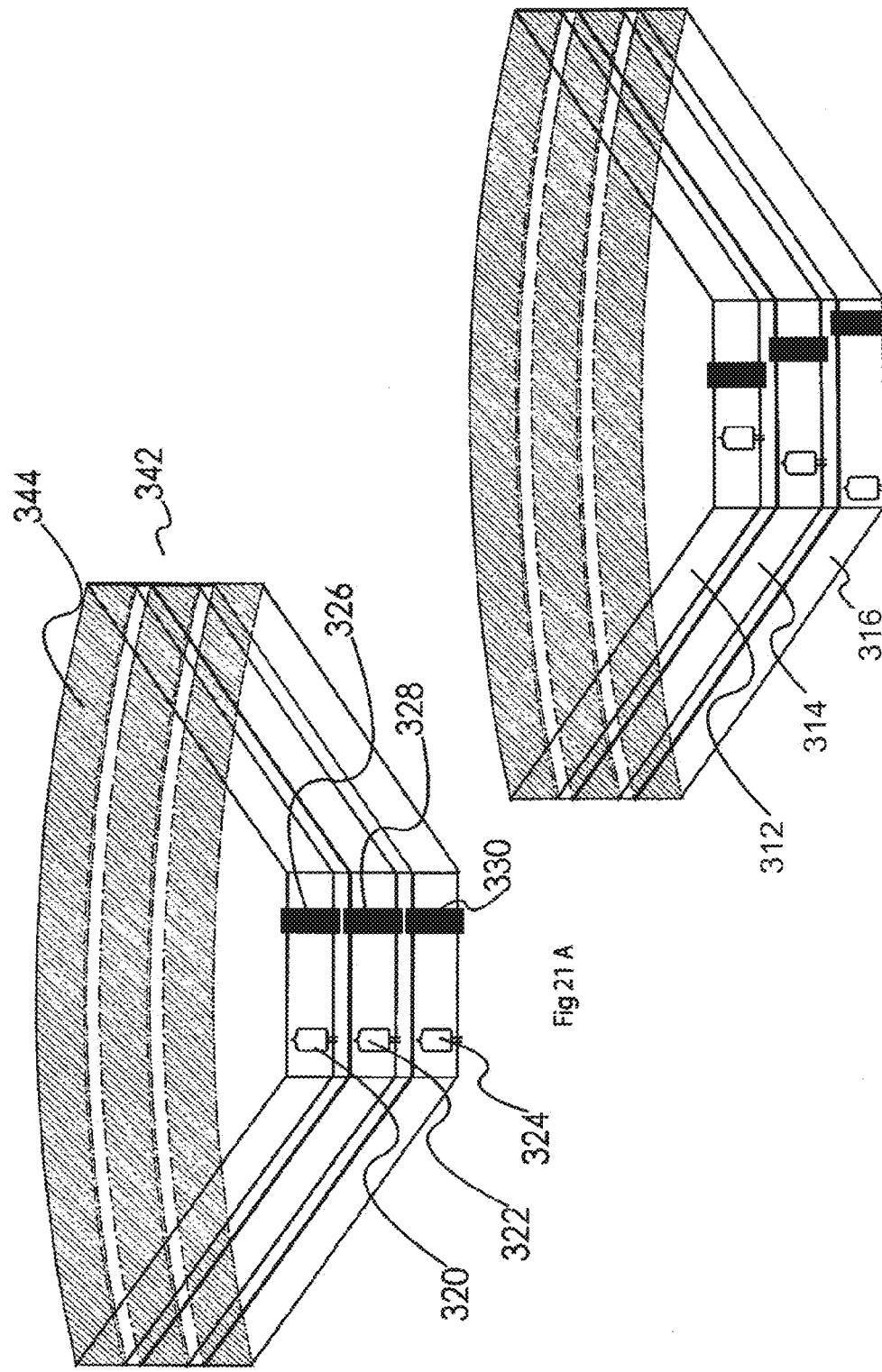

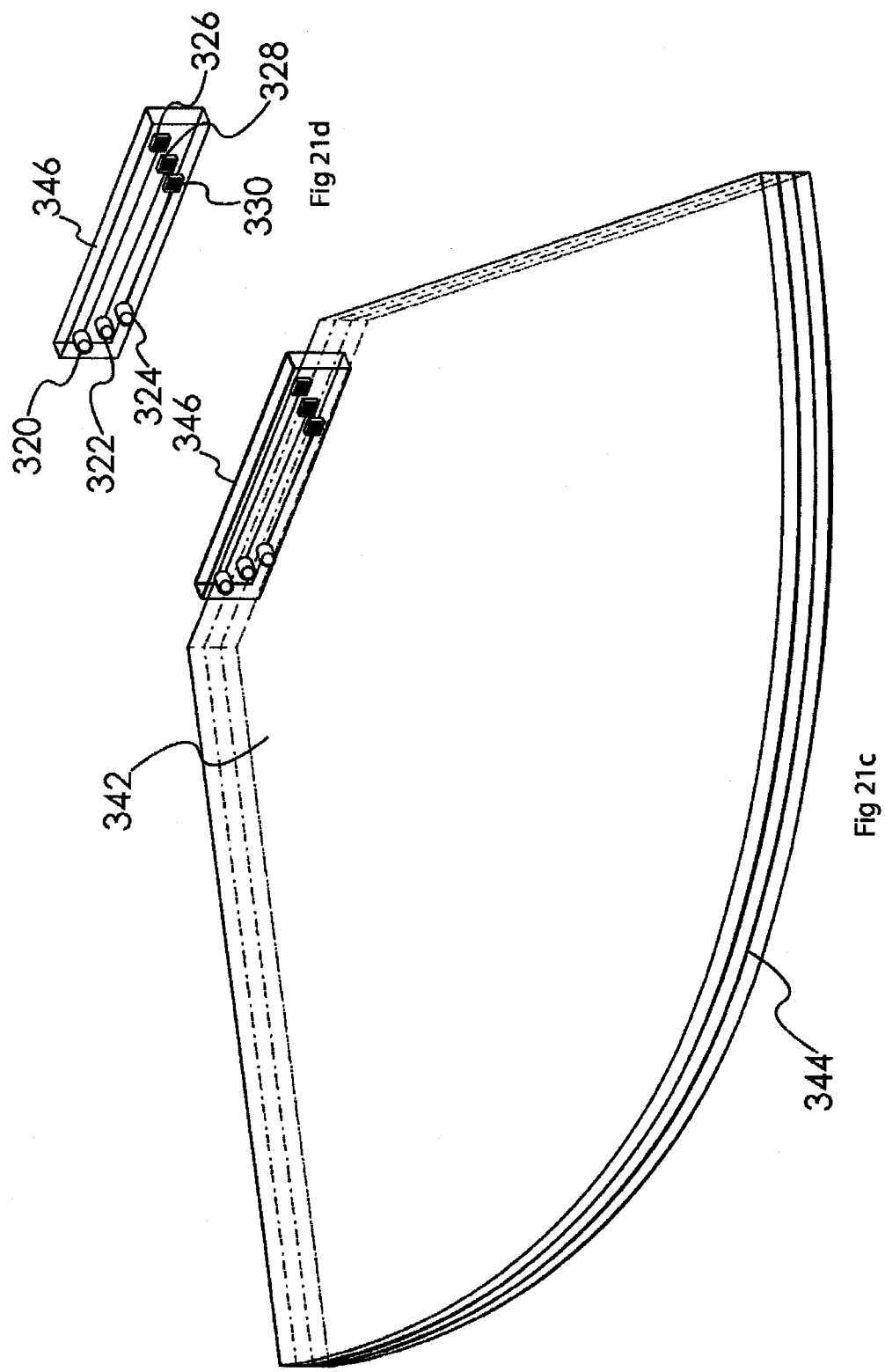

US 9,256,018 B2

STIMULATED EMISSION LUMINESCENT LIGHT-GUIDE SOLAR CONCENTRATORS

CROSS-REFERENCE TO RELATED APPLICATIONS

The present application claims priority to Canadian Patent Application No. 2,658,193, filed Mar. 12, 2009, entitled Stimulated Emission Luminescent Light-Guide Solar Concentrators and to U.S. Provisional patent application No. 61/298,460, filed Jan. 26, 2010, entitled Stimulated Emission Luminescent Light-Guide Solar Concentrators. The entirety of both of these documents is incorporated herein by reference.

FIELD OF THE INVENTION

The present invention relates to luminescent solar concentrators.

BACKGROUND OF THE INVENTION

The harvesting of solar energy is a field with a multiplicity of different technologies for converting sunlight to electricity. To date, none of the technologies has become sufficiently inexpensive to displace traditional means of generating electricity, and as a result solar energy remains a marginal contributor to global power needs. The main cost driver in solar power systems is the high cost of the photovoltaic (PV) cells, which are the semiconductor junctions that convert light into electricity.

One of the many avenues being investigated for reducing the cost of electricity produced by solar power is called "Concentrated Photovoltaics", or CPV. The basic idea behind CPV is to use some sort of optic, generally a Fresnel lens or another focusing optic, to concentrate sunlight onto tiny, high-efficiency PV cells. The PV cells employed are compound semiconductor cells with multiple junctions in a stack and electrically connected in series. The most typical convetional cells for CPV are three junction cells using indium gallium phosphide, indium gallium arsenide, and germanium cells all arranged in series. Each of these cells converts a portion of the solar spectra into electricity. These systems are very energetically productive but they have a major downside in that they require trackers to orient them to face the sun at all times in order for their optics to function. This need for trackers makes these systems practical for use in solar farms, where large post-mounted trackers are mounted on the ground. Trackers are impractical, however, for systems intended for building integration and roof mounting (which represents a massive portion of the solar market). CPV systems use high sunlight concentration, as high as 2000 suns, meaning that only a tiny amount of photovoltaic material would be required as compared with a conventional non-concentrated PV system.

Another approach to concentration is the use of luminescent solar concentrators. These devices consist of a sheet of glass that contains either a layer of luminescent particles or has luminescent particles impregnated throughout the glass. Luminescent particles absorb light over a wide band of frequencies and emit light at lower frequencies over a narrower band. Examples of luminescent particles are organic dyes, laser dyes and nano-crystals.

When these luminescent particles emit light, the light emitted travels in a random direction. Because this light is emitted evenly in every direction from inside the glass, any emitted radiation which strikes the top of bottom faces of the glass sheet, and which has an angle of incidence with respect to the surface normal of the glass sheet greater than the critical angle for total internal reflection, will be trapped within the glass sheet by total internal reflection. (If the glass has an index of 1.5 and the surrounding media is air then the critical angle is approximately 41.8 degrees.) In fact, the only light which will not become trapped within the glass is any light that is emitted within one of two cones of emission centered on the normal of the top and bottom glass surfaces and with base angles of 83.6 degrees.

Light thus trapped will travel in all directions within the glass to the four edges of the glass where it can be harvested for energy production by photovoltaic cells. Because the frequency of the emitted light is relatively narrow, it is possible to use single junction cells in this instance in a very efficient manner, provided the single junction cells have the correct band gap. In principal, infinite concentration could be achieved in this manner except there are two fundamental limitations: absorption within the glass and re-absorption by the luminescent particles. The first, absorption within the glass itself, limits the practical optical path length and thus the size of the glass sheet and the concentration. Re-absorption and emission also limit the practical concentration. To date the best-predicted concentration by this means is on the order of 150 suns. This is far lower that the concentrations achievable by CPV as noted above. Thus cost savings in a luminescent concentration system achieved by not having a tracker are greatly overwhelmed by the extra cost of requiring several times more photovoltaic cell material. Thus, to date, luminescent concentration systems in are not in widespread commercial use and improvements in this technology are desirable, given its inherent advantages noted above.

SUMMARY OF THE INVENTION

It is thus an object of the present invention to provide an improved luminescent solar concentrator as compared with at least some of those of the prior art.

Thus, in one aspect, as embodied and broadly described herein the present invention provides a stimulated emission luminescent light-guide solar concentrator. The concentrator comprises a luminescent layer having a plurality of luminescent particles. The luminescent particles are capable of becoming excited by absorbing solar light of at least a first absorption frequency. Once excited, the luminescent particles are capable of being stimulated to emit luminescent light at at. least a first emission frequency. The concentrator also comprises a light source for generating a pump light of at least the first emission frequency for stimulating at least one of the excited luminescent particles having absorbed solar light such that when the pump light traveling in a first direction of travel stimulates the at least one of the luminescent particles having absorbed solar light at the first absorption frequency the at least one of the luminescent particles emits luminescent light at the at least first emission frequency in the first direction of travel of the pump light, intensifying the pump light. The concentrator also comprises a first light guide adjacent to and optically coupled with the luminescent layer. The first light-guide is for assisting in guiding the intensified pump light via total internal reflection to a light collection area.

Embodiments of this aspect of the present invention are improved luminescent solar concentrators that can concentrate light to orders of magnitude greater than conventional luminescent solar concentrators. This is achieved by forcing the luminescent particles to emit light in a prescribed direction rather than in a random direction, as is conventionally the case. The emission of the luminescent particles is forced using the principal of stimulated emission. Stimulated emission occurs when an electron in an excited state is perturbed by a passing photon. The stimulating photon needs to have a frequency equal to the frequency of the emitted photons for this stimulation to occur. When the stimulation does occur, the electron drops to the ground state and the emitted photon travels in phase with and in the same direction as the stimulating photon. This principal of stimulated emission is the operating principal of a laser. Thus, in some embodiments of this aspect of the present invention, a narrow band light source, such as a light-emitting diode, at the same frequencies as the luminescent emission is employed to stimulate emission in a prescribed direction. The stimulation can be done in such a way so that (if desired) all light converges to a point and is concentrated to a very high degree where one can place a PV cell. In some embodiments, the power required by the diode can be produced at the cell. The light from the light emitting diode and the captured sunlight can both be absorbed by the PV cell producing a net gain in electricity.

In some embodiments, the luminescent particles are capable of absorbing solar light within at least a first spectrum of absorption frequencies and emitting luminescent light within at least a first spectrum of emission frequencies. In some embodiments, some of the luminescent particles are capable of absorbing solar light of at least a first absorption frequency and emitting luminescent light at at least a first emission frequency and others of the luminescent particles are capable of absorbing solar light of at least a second absorption frequency different from the first absorption frequency and emitting luminescent light at at least a second emission frequency different from the first emission frequency.

In some embodiments, the luminescent layer and the first light-guide layer form a unitary optically-active structure such that intensified pump light is guided to the light collection area via total internal reflection at least within the unitary optically-active structure. In some embodiments, intensified pump light is guided to the light collection area via total internal reflection solely within the unitary optically-active structure.

In some embodiments, the concentrator is generally in the shape of a disk. In some such embodiments, the concentrator is generally in the shape of a circular disk, the circular disk having a focus, and wherein the light source and the light collection area are at the focus. In other such embodiments, the concentrator is generally in the shape of an elliptical disk, the elliptical disk having two foci, and wherein the light source is at one of the foci and the light collection area is at the other of the foci.

In some embodiments, the concentrator is generally in the shape of a section of an elliptical disk. The section of the elliptical disk has two foci on an edge thereof. The light source is at one of the foci and the light collection area is at the other of the foci.

In some embodiments, the concentrator is generally in the shape of plurality of sections of elliptical disks forming a reflecting edge of many reflecting facets. Each of the plurality of sections of elliptical disks has two common foci on an edge thereof opposite the reflecting edge. The light source is at one of the common foci and the light collection area is at the other of the common foci. In some such embodiments, the light source and the light collection area are located adjacent one another on the edge. In another aspect of the invention, there is an assembly of a plurality of such stimulated emission luminescent light-guide solar concentrators wherein side edges of adjacent individual solar concentrators are abutting.

Returning the aforementioned first aspect of the invention, in some embodiments, the concentrator is generally in the shape of a square disk having a reflecting edge of many facets having reflective edges. The reflecting edge of each facet comprises a plurality of sections of an elliptical disk, each of the sections of the elliptical disk having common two foci. The light source is at one of the foci and the light collection area is at the other of the foci.

In some embodiments, there is a first secondary optic adjacent the light source. In some such embodiments the first secondary optic is made of a different material than adjacent materials to provide for protection from heat.

In some embodiments, there is a second secondary optic adjacent the light collection area. In some such embodiments, the second secondary optic is made of a different material than adjacent materials to provide for protection from heat.

In some embodiments, there is a first reflector positioned at an edge opposite the light collection area so as to reflect light back into the unitary optically-active structure towards the light collection area.

In some embodiments there is a second light-guide layer optically coupled to the unitary optically-active structure. The second light-guide layer is for guiding at least light received from the unitary optically-active structure to the light collection area.

In some such embodiments the second light-guide layer is optically coupled to the unitary optically-active structure via at least a second reflector. In some such embodiments, the second reflector operates via total internal reflection. In some such embodiments, the second reflector is a mirror.

In some such embodiments, the concentrator is generally in the shape of a disk. In some such embodiments each of the unitary optically-active and the second light-guide is generally in the shape of a disk. In some such embodiments, the unitary optically-active and the second light-guide are stacked one upon the other and are separated from one another by a first material having a lower index of refraction than that of both the unitary optically-active and the second light-guide. In some such embodiments, the first material is air.

In some such embodiments, a macroscopic direction of travel of light within the unitary optically-active structure and a macroscopic direction of travel of light within the second light-guide are generally opposite one another.

In some such embodiments, the light source and the light collection area are located adjacent one another. In some such embodiments, the light source and the light collection area are located on top of one another.

In some such embodiments, there is a third secondary optic optically in between the second light-guide and the light collection area. In some such embodiments, the third secondary optic is made of a different material than adjacent materials to provide for protection from heat.

In some such embodiments, there is a fourth secondary optic optically in between the second light-guide and the light collection area. In some such embodiments, the fourth secondary optic is made of a different material than adjacent materials to provide for protection from heat.

In some embodiments, the luminescent layer consists of a transparent substrate and the luminescent particles are a luminescent dye impregnated in the substrate.

In some embodiments, the light source is a point source. In some such embodiments, the light source is a light-emitting diode. In some embodiments the light source is a plurality of light sources. In some such embodiments, the light source is a plurality of light-emitting diodes.

In another aspect, the present invention provides a solar energy collector comprising a stimulated emission luminescent light-guide solar concentrator as described hereinabove and at least one photovoltaic cell disposed at the light collection area of the concentrator. In some embodiments of this aspect of the invention, the light source of the concentrator is powered by energy from the at least one photovoltaic cell. In some embodiments, the light source and the at least one photovoltaic cell are disposed on a single circuit board.

In another aspect, the present invention provides a solar energy collector assembly comprising an array of solar energy collectors described herein above. In some embodiments of this aspect, there is a third reflector optically behind the array of solar energy collectors. In some embodiments, of each of the stimulated emission luminescent light-guide solar concentrators of the array are powered by a single energy source.

Returning to the first aspect, in some embodiments, the luminescent layer is a first luminescent layer, the plurality of luminescent particles are a first plurality of particles, the light source is a first light source, the pump light is a first pump light, and the light collection area is a first light collection area. The concentrator further comprises a second luminescent layer adjacent the first light-guide layer. The second luminescent layer has a second plurality of luminescent particles. The second plurality of luminescent particles are capable of becoming excited by absorbing solar light within at least a second spectrum of absorption frequencies at least partially different from the first spectrum of absorption frequencies. Once excited, the second plurality of luminescent particles are capable of being stimulated to emit luminescent light within at least a second spectrum of emission frequencies at least partially different from the first spectrum of emission frequencies. The concentrator further comprises a second light source for generating a second pump light within at least the second spectrum of emission frequencies for stimulating at least one of the excited particles of the second plurality of luminescent particles having absorbed solar light such that when the second pump light traveling in a second direction of travel simulates the at least one of the second plurality luminescent particles having absorbed solar light at the second spectrum of absorption frequencies the at least one of the second plurality of luminescent particles emits luminescent light at the at least second spectrum of emission frequencies in the second direction of travel of the second pump light, intensifying the second pump light. The concentrator further comprises a third light guide layer adjacent to and optically coupled with the second luminescent layer. The third light-guide layer is for assisting in guiding the intensified second pump light via total internal reflection to a second light collection area. In some such embodiments, the first light-guide and the second luminescent layer are separated from one another by a second material having a lower index of refraction than that of both the first light-guide and the second luminescent layer.

In some embodiments, the concentrator further comprises a third luminescent layer adjacent the third light-guide layer. The third luminescent layer has a third plurality of luminescent particles. The third plurality of luminescent particles are capable of becoming excited by absorbing solar light within at least a third spectrum of absorption frequencies at least partially different from the first spectrum and the second spectrum of absorption frequencies. Once excited, the third plurality of particles are capable of being stimulated to emit luminescent light within at least a third spectrum of emission frequencies at least partially different from the first spectrum and the second spectrum of emission frequencies. The concentrator further comprises a third light source for generating a third pump light within at least the third spectrum of emission frequencies for stimulating at least one of the excited particles of the third plurality of luminescent particles having absorbed solar light such that when the third pump light traveling in a third direction of travel stimulates the at least one of the third plurality luminescent particles having absorbed solar light within the third spectrum of absorption frequencies the at least one of the third plurality of luminescent particles emits luminescent light within the at least third spectrum of emission frequencies in the third direction of travel of the third pump light, intensifying the third pump light. The concentrator further comprises a fourth light guide layer adjacent to and optically coupled with the third luminescent layer. The fourth light-guide layer is for assisting in guiding the intensified third pump light via total internal reflection to a third light collection area. In some such embodiments, the third light-guide and the third luminescent layer are separated from one another by a third material having a lower index of refraction than that of both the third light-guide and the third luminescent layer.

In a further aspect, the present invention provides a solar energy collector comprising a stimulated emission luminescent light-guide solar concentrator as described hereinabove and at least one photovoltaic cell disposed at each of the first light collection area, the second light collection area and the third light collection area of the concentrator. In some embodiments, each of the first light source, the second light source, and the third light source is powered by energy from at least one of the photovoltaic cells. In some embodiments, each of the light sources and each of the photovoltaic cells are all disposed on a single circuit board.

In a further aspect, as embodied and broadly described herein, the present invention provides a method of concentrating solar light, comprising: (i) Exposing a luminescent layer of material having a plurality of luminescent particles to solar light causing the luminescent particles to become excited by absorbing solar light of at least a first absorption frequency, the excited luminescent particles capable of being stimulated to emit luminescent light at at least a first emission frequency. (ii) Stimulating the excited luminescent particles via pump light at the at least first emission frequency travelling in a first direction to cause the excited luminescent particles to emit luminescent light at the at least first emission frequency in the first direction of travel of the pump light, intensifying the pump light. (iii) Trapping the intensified pump light in a light-guide formed in part by the luminescent layer and in part by additional material adjacent to and optically coupled with the luminescent layer. (iv) Allowing the intensified pump light to propagate via total internal reflection in the light-guide to a light collection area.

It should be understood that the usage of the descriptors first, second, third, etc. in relation to any particular element does not necessarily mean that in any particular embodiment there are present that number of that element (although there may be). These words are generally used throughout the present specification merely to distinguish between different elements having similar names.

Embodiments of the present invention each have at least one of the above-mentioned objects and/or aspects, but do not necessarily have all of them. It should be understood that some aspects of the present invention that have resulted from attempting to attain the above-mentioned objects may not satisfy these objects and/or may satisfy other objects not specifically recited herein.

Additional and/or alternative features, aspects, and advantages of embodiments of the present invention will become apparent from the following description, the accompanying drawings, and the appended claims.

BRIEF DESCRIPTION OF THE DRAWINGS

Embodiments of the present invention will now be described, by way of example only, with reference to the attached Figures, wherein:

FIG. 4 shows a stimulated emission luminescent sheet for capturing sunlight, FIG. 5 shows a stimulated emission luminescent sheet for capturing and concentrating sunlight, FIG. 6 shows an elliptical stimulated emission luminescent sheet for capturing and concentrating sunlight, FIG. 7 shows a half elliptical stimulated emission luminescent sheet for capturing and concentrating sunlight, FIG. 8 shows a wedge shaped stimulated emission luminescent sheets for capturing and concentrating sunlight, FIG. 11 shows another embodiment of a bi-layer stimulated emission luminescent light guide solar concentrator with a secondary optic, FIG. 13 shows how in a bi-layer stimulated emission luminescent light guide solar concentrator the photovoltaic cell and light source can both be mounted on the same circuit board, FIG. 19 shows an exemplary set of absorption and emission spectrum from multiple luminescent materials, FIG. 20 shows a side view of a stimulated emission luminescent light guide solar concentrator with multiple layers, FIG. 21 shows views of a stimulated emission luminescent light guide solar concentrator with multiple layers.

DETAILED DESCRIPTION OF PREFERRED EMBODIMENTS

Figure 1:
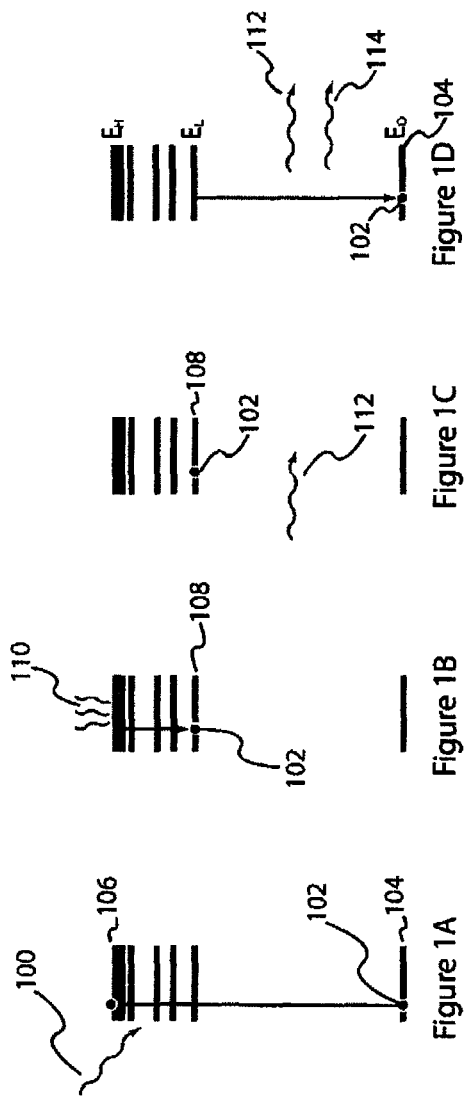
FIG. 1 shows a simple overview of a luminescent system.

In stimulated emission luminescent solar concentrators, a luminescent sheet is exposed to sunlight and is pumped by a light source, such as a laser, a diode or other light source. FIGS. 1A-1G illustrate the energy states of electrons during the process. In FIG. 1A, an incident photon from sunlight 100 is absorbed by the luminescent particles and excites an electron 102 from the ground state 104 (labeled $E_0$) into a higher state 106 (labeled $E_H$). In FIG. 1B the electron 102 decays to a lower energy state 108 (labeled $E_L$) and in the process releases some energy as photons or heat 110. The lower energy state 108 is referred to in this document as the luminescent state. If an electron is left alone in the luminescent state for a long enough period of time, then it will decay back to the ground state and release a photon with a frequency called the luminescent frequency that travels in a random direction. The luminescent frequency is lower than the frequency of the original absorbed photon 100, which means the emitted photon has less energy than the absorbed photon. In FIG. 1C a passing photon 112 is shown that has a frequency equal to the luminescent frequency. As shown in FIG. 1D, this photon 112 will perturb (stimulate) the electron 102 in the luminescent state 108 and cause it to decay to the ground state 104, emitting a photon 114. The emitted photon 114 is at the same frequency, is in phase with, and travels in the same direction as the stimulating photon 112.

An external view is shown in FIG. 1E. Sunlight 116 strikes a cluster of luminescent particles 120 (being one molecule or several). A passing pump beam 118 with the same frequency as the luminescent frequency stimulates emission and causes the luminescent particles to emit a beam 122 parallel to and with the same frequency as the pump beam 118 that also continues to propagate.

The luminescent state described above is only one example of a luminescent particle, and in fact the picture can be more complicated and can involve continuous or pseudo-continuous energy bands instead of discrete states. In that case, the emitted light from the diode would have the same spectrum as the luminescent emission. It is the same as described above except that the light in question varies in frequency over a narrow band and defines a spectrum rather than being at a particular, precise frequency.

A luminescent system can also involve more energy states than stated above. Multiple photons can be involved in the excitation step, and there can be multiple decay steps prior to the luminescent emission step. The present invention covers any luminescent system, irrespective of the number of energy states. Additionally, some luminescent systems contain multiple luminescent particles with different absorption and emission spectra where one particles' emission is absorbed by another particle. This invention covers those luminescent systems as well.

The explanation given above is intended to be easily understood by a wide audience. The next section is a more technical explanation. It should be noted that the word "dye" in the present specification refers to a luminescent material, including, but not limited to organic and inorganic dyes, doped glasses and crystals (e.g. $Nd^{3+}$ in YAG or glass, Ti in sapphire), and quantum dots. In should also be noted that luminescence in the present application includes photoluminescence.

Figure 2:
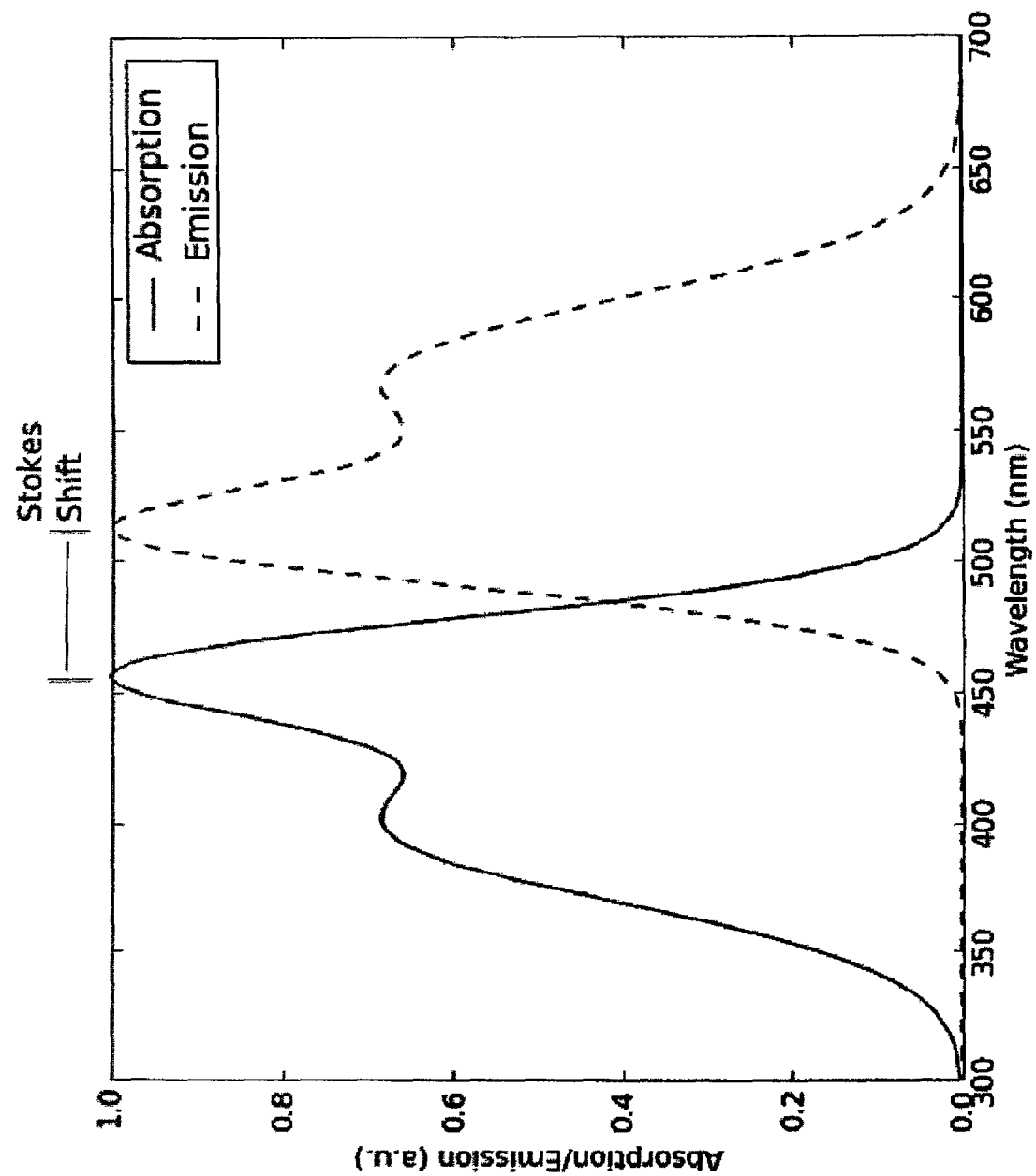
FIG. 2 shows the Absorption Emission Spectrum of a typical dye.

The luminescent sheet consists of a transparent substrate, such as a glass, silicone, or polymer with a luminescent dye evenly impregnated throughout the substrate or applied as a thin film on the surface. The dye absorbs a portion of the incoming solar radiation, promoting dye molecules to an excited state. The dye undergoes fast internal relaxation to a lower energy level, after which it may spontaneously emit a photon at a lower energy, the difference in energy between the peak of the absorption and emission profiles is called a Stoke's Shift. A large Stoke's shift may be desired as it inhibits the reabsorption of emitted photons by the luminescent dye. FIG. 2 demonstrates the Stokes shift between emission and absorption spectra.

A bright, narrow band light source (pump), a laser or LED, is added that launches light into the plane of the luminescent sheet, the light being confined to the sheet by total internal reflection. The pump light source is chosen such that its wavelength is within the emission spectrum of the dye. An excited dye molecule illuminated by the pump light has some chance of emitting a photon identical to the pump light through stimulated emission, which competes with the spontaneous emission of photons. Photons resulting from stimulated emission will travel through the concentrating sheet and be concentrated at the photovoltaic cell. Photons resulting from spontaneous emission are emitted in a random direction, with some fraction of the photons (those with angles greater than ~45 degrees relative to the plane of the sheet) being coupled out of the sheet. Spontaneously emitted photons are not concentrated.

The probability that an excited dye molecule will decay via stimulated emission is given by the ratio of the rate of stimulated emission to the total relaxation rate.

$$p_{stim} = R_{stim}/(R_{stim} + R_{sp})$$

where $p_{stim}$ is the probability of stimulated emission, $R_{stim}$ is the rate of stimulated emission, and $R_{sp}$ is the rate of spontaneous emission The rate of stimulated emission is given by $$R_{stim} = \sigma_e I/h\nu$$

where $\sigma_e$ is the stimulated emission cross-section at the pump wavelength, I is the intensity of the incident light, h is Planck's constant, and v is the frequency of the light. The rate of spontaneous emission, $R_{sp}$, is given by the inverse of the fluorescent state lifetime $\tau_{sp}$ as in $$R_{sp} = 1/\tau_{sp}.$$

Dye molecules decay through non-radiative mechanisms as well as radiative ones, resulting in a fluorescence quantum yield (QY) less than unity. The non-radiative mechanism can be a probabilistic splitting between pathways from a high energy singlet state during the initial relaxation, with some probability QY that the radiative path was taken, and probability 1-QY that the non-radiative path was taken. Alternatively, the non-radiative mechanism can be a relaxation process from the luminescent state that competes with the radiative path, characterized by a non-radiative relaxation rate $R_{ur}$, with the quantum yield given by $QY = R_{sp}/(R_{sp} + R_{ur})$.

In the first case, with a non-radiative path from the highly excited state, the probability of stimulated emission is replaced with $$p_{stim} = QY * R_{stim}/(R_{stim} + R_{sp})$$

In the second case, the probability of stimulated emission is replaced with $$p_{stim} = R_{stim}/(R_{stim} + R_{sp} + R_{ur}).$$

Dyes are chosen so that they have a high stimulated emission cross section and high quantum yield.

Figure 3:
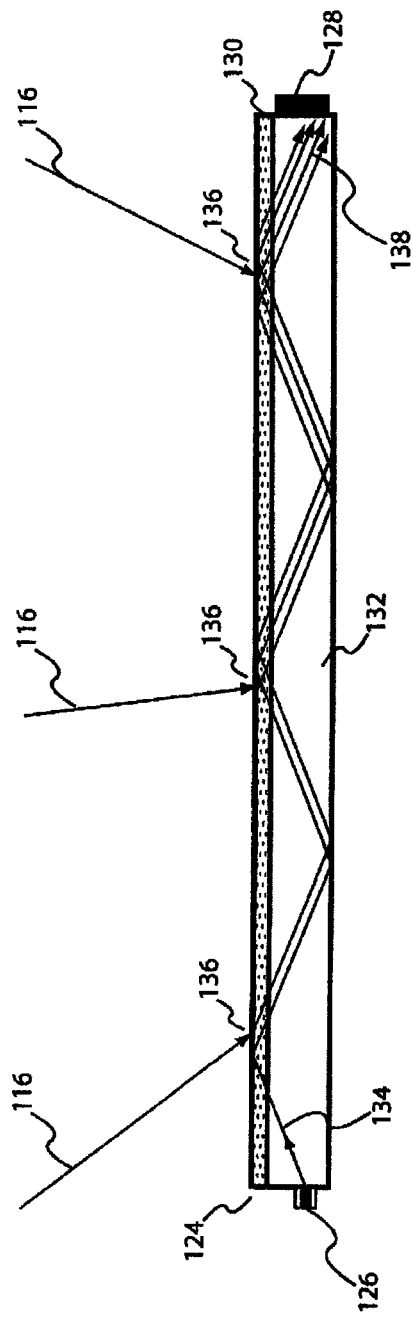
FIG. 3 shows a cross sectional view of one embodiment stimulated emission luminescent solar concentrator.

A stimulated emission luminescent light-guide concentrator, such as is illustrated in FIG. 3, is made using a luminescent sheet 124, a light source 126, and a photovoltaic (PV) cell 128. The luminescent sheet can be made by applying a thin layer of luminescent particles 130 to a side of a sheet of glass 132 as described above. The luminescent particles can be suspended in a matrix of another material such as PMMA, urethane, clear silicone, or even a solvent such as ethanol which is sealed between two sheets of glass. Alternatively the luminescent sheet can be made by impregnating a sheet of glass with luminescent particles. The luminescent layer 130 on the glass sheet 132 absorbs incident sunlight 116. The absorbed sunlight causes electrons to be excited into a luminescent state as described above. A light source 126 shoots a ray of light 134 into the sheet of glass and it is trapped in the sheet by total internal reflection, this light is called the pump light and it has a spectrum equal to the luminescent emission spectrum. Wherever the pump light 134 encounters excited electrons in the luminescent state, such as at the locations labeled 136, the electrons decay to the ground state and emit light that travels parallel to the pump light 134, increasing its intensity. The pump light gradually accumulates more intensity as more and more emitted light is added to the pump light. Furthermore, light whose emission is stimulated by the pump light upstream can stimulate emission downstream. The result is that an intensified pump light 138 remains trapped in the glass sheet and conducting towards the PV cell 128.

FIG. 3 shows a cross sectional view of one embodiment of a stimulated emission luminescent solar concentrator. It is clear from the figure that, from left to right, the intensity of light inside the concentrator increases as the original beam is augmented by trapped sunlight so that it is at its lowest intensity immediately beside the light source 126 and at its highest intensity at the PV cell 128.

Next, three dimensional designs employing small light sources that act as point sources will be described. A light source 126 is a point source at the center of a round luminescent sheet 140 as is shown in FIG. 4. The emitted light from the source 134 will cause sunlight 116 absorbed by luminescent particles at locations 136 then it will cause stimulated emission creating intensified light 138 towards the outside edge 142. FIG. 4A shows a cross sectional view of this system. FIG. 4B shows a three dimensional view of this system. FIG. 4C shows a top down view of the system. (Although the light rays in this Figure and in the Figures that follow are show as straight, this is only for ease of illustration. As would be understand by one of skill in the art on reading this specification, the light would follow the jagged path described in FIG. 3.)

If, as shown in FIG. 5, the outer edge of the disk is coated with a mirror 144 to reflect the light back, then the reflected light 146 will focus to the center of the disk. The light that is concentrated to the center of the disk will by far exceed in intensity the light that the source 126 initially launched into the disk because it has collected sunlight along the way. As the light 146 focuses to the center of the disk it will be able to further cause stimulation, further intensifying the light. Having a solar energy collector, such as a photovoltaic cell, coincident with the light source 126, this device is able to convert the solar energy converging on the center of the disk into electricity. This electricity would be able to power the light source and would also deliver a usable electric current which would be harnessed for use elsewhere. Conservation of energy is observed, the pump light from the light source is powered by light on the photovoltaic cell, and pump light is used to stimulate captured solar radiation and cause it to focus on the photovoltaic cell. If a constant source of sunlight is removed from the system, then it ceases to function immediately and the device will cease to operate until sunlight or another light source is again applied.

In situations where it is difficult to make a solar energy collector and a light source coincident, the disk could be made in an elliptical shape. If the disk is made in an elliptical shape then the light spreads out from one foci and converges on another. This is shown in FIG. 6. The light source 126 is positioned at the first foci 148 of the elliptical plate 150. Light is emitted as before and reflects off the mirrored rim 144. The reflected light 146 converges to the second foci 152 where there is a solar energy collector 154. As before, the light converging on the solar energy collector 154 is much more intense and has more power than was used to power the light source 126. The pump light 134 is augmented in intensity as it stimulates the emission of light when it passes luminescent particles that have absorbed incident sunlight 116. This augmented light then further causes stimulated emission creating a cascade effect that increases in intensity and power to a maximum at the second foci 152 where it is converted into electricity at a very high concentration factor. The light source 126 and the solar energy collector 154 can be placed on a single circuit board for convenience if they are relatively close together. The ellipse can be altered to increase or decrease the spacing distance between the light source and the solar energy collector.

FIG. 7 shows how a half elliptical plate 156 can be used rather than a full elliptical plate. This allows for mounting of the light source 126 and the photovoltaic cell 154 at the foci 148 and 152 respectively on the edge 158 of the plate 156. Edge mounting may be more convenient than mounting in the center of the plate as was shown previously.

FIG. 8 shows another variant on the design from FIG. 7. The elliptical plate has been sliced into a wedge shaped section 160. The ellipse is nearly circular so that the two foci 162 and 164 are close together. The light source 126 and photovoltaic cell 154 are edge mounted on the face 166. This design can be realized with a section of a circular disc instead of a wedge from an ellipse as well, provided the light source and the photovoltaic cell are both off the center of the circle. A more perfect focus can be achieved with an elliptic section, and this can increase concentration, but concentration might be high enough with a circular section, depending on the application.

Figure 9D:
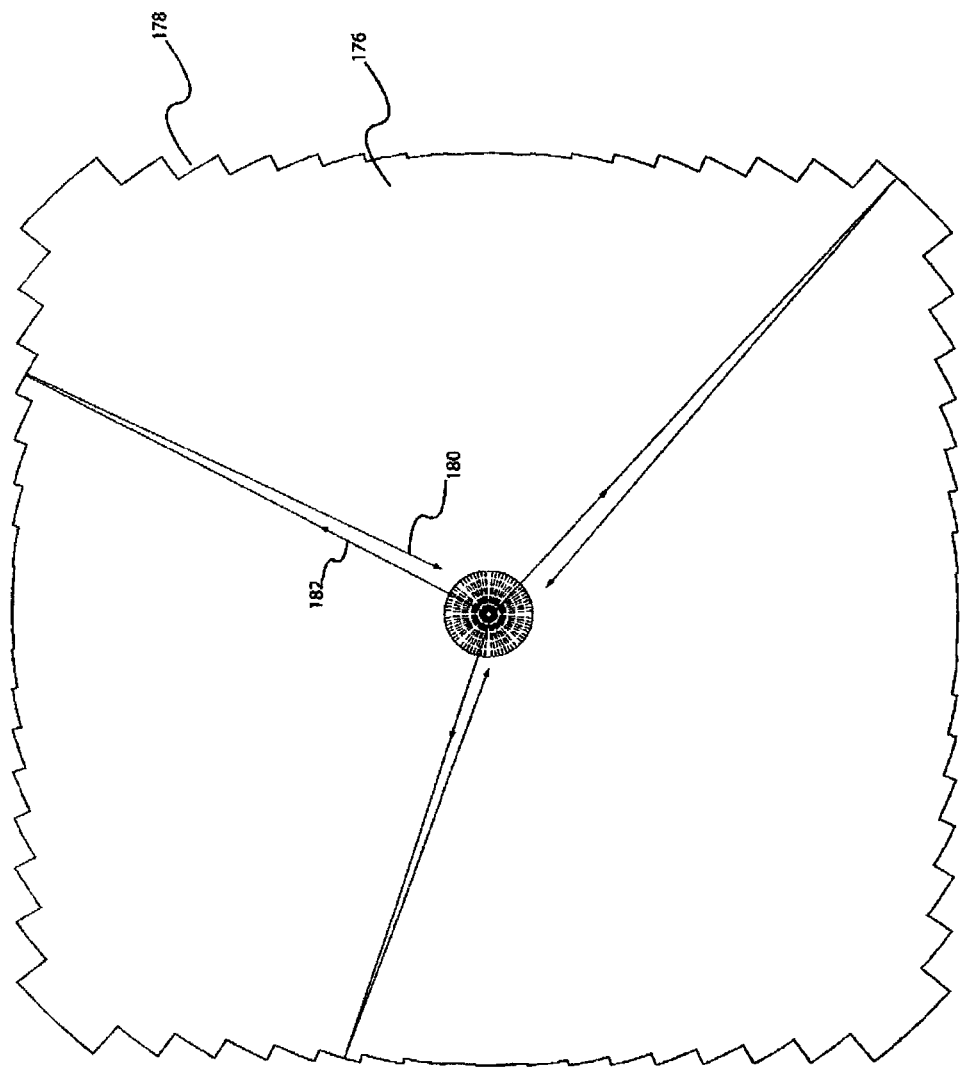
FIG. 9 shows ways to change the external shape of the stimulated emission luminescent sheets without altering functional performance.

FIG. 9 shows a very similar embodiment again with a wedge shaped luminescent concentrator 168. However multiple reflecting facets 170 now replace the reflecting edge 144 that was previously a single elliptical arc. Only three facets 170 are shown in FIG. 9A. In principal the facets could become increasingly small and the surface defined by the facets increasingly flat. FIG. 9B shows a wedge shaped luminescent concentrator 172 with a face 174 made up of a collection of tiny facets (not shown) that redirect incident radiation from the light 126 to the photovoltaic cell 154. The advantage of the design in FIG. 9B is that is allows for very close packing, as shown in FIG. 9C. FIG. 9D shows that this way of breaking up a curved face into a more flat series of facets can be done to any curve. Shown is a disk that has been thusly transformed into a square luminescent solar concentrator 176. Each of the facets 178 reflects light from the center back towards the center. The reflected rays 180 are shown at a slight angle for clarity, in fact they would overlap the rays 182 coming from the center of the sphere perfectly. The idea of breaking up a curved mirror surface into a flat series of small curved facet could applies universally to all the embodiments described herein. In general they will be shown with a single curve, such as a circle or ellipse however they could all be squared off in the manner described above.

It is possible to devise systems where the luminescent sheet traps the light but is not exposed to excessive concentration. All the designs shown above concentrated the trapped light inside the luminescent sheet to which a solar energy collector was attached. If a second sheet is introduced, a concentrator sheet, then the flux density (intensity) inside the luminescent sheet does not need to exceed the concentration at the light source itself. In FIG. 10, there is shown the same luminescent sheet 140 from FIGS. 4 and 5 with a mirror 144 around the rim of the disk. Now however, there is a second sheet 184 underneath the luminescent sheet. Light that reflects off the mirror 144 is reflected slightly downwards and instead of entering the luminescent sheet it instead couples into the concentrator sheet 184 (which serves as a light guide). The light propagates to photovoltaic cells 186, in this embodiment they are arranged in a square hole 188 in the center of the concentrator sheet 184. There is an air gap 190 between the luminescent sheet 140 and the concentrator sheet 184. This air gap does not extend all the way to the mirror in order to let the light in the luminescent sheet exit the luminescent sheet and enter the concentrator sheet. The air gap is needed so that the light stays trapped in the concentrator sheet by total internal reflection. Taken as a whole, the embodiment 192 is called a bi-layer luminescent solar concentrator. Several more embodiments of bi-layer luminescent solar concentrators will be outlined in the next sections, but first some of the merits of the bi-layer design will be addressed.

Figure 10D:
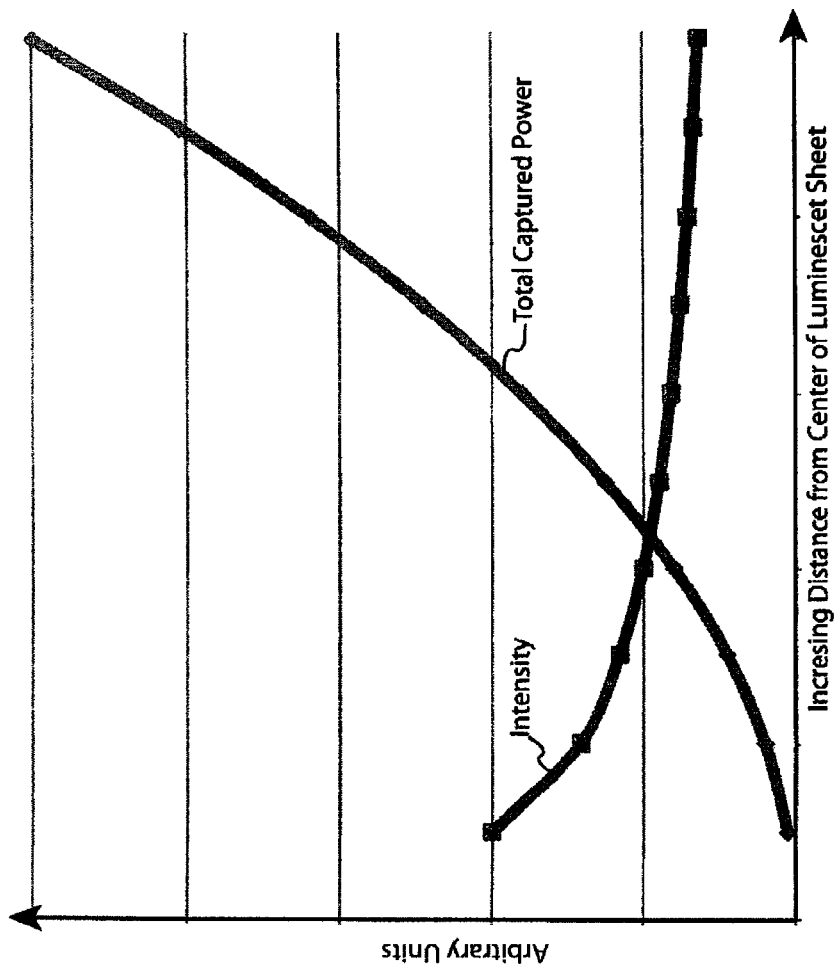
FIG. 10 shows a bi-layer stimulated emission luminescent light guide solar concentrator.
Figure 10C:
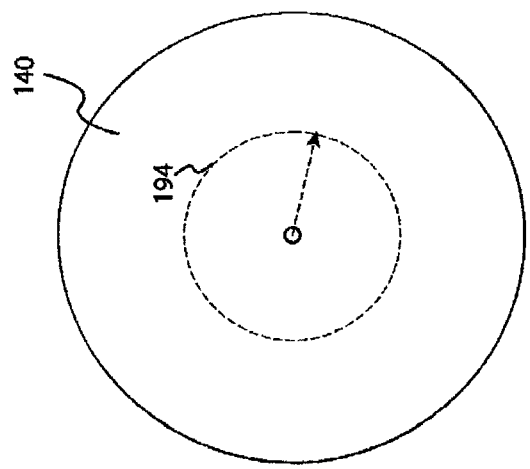
Figure 10F:
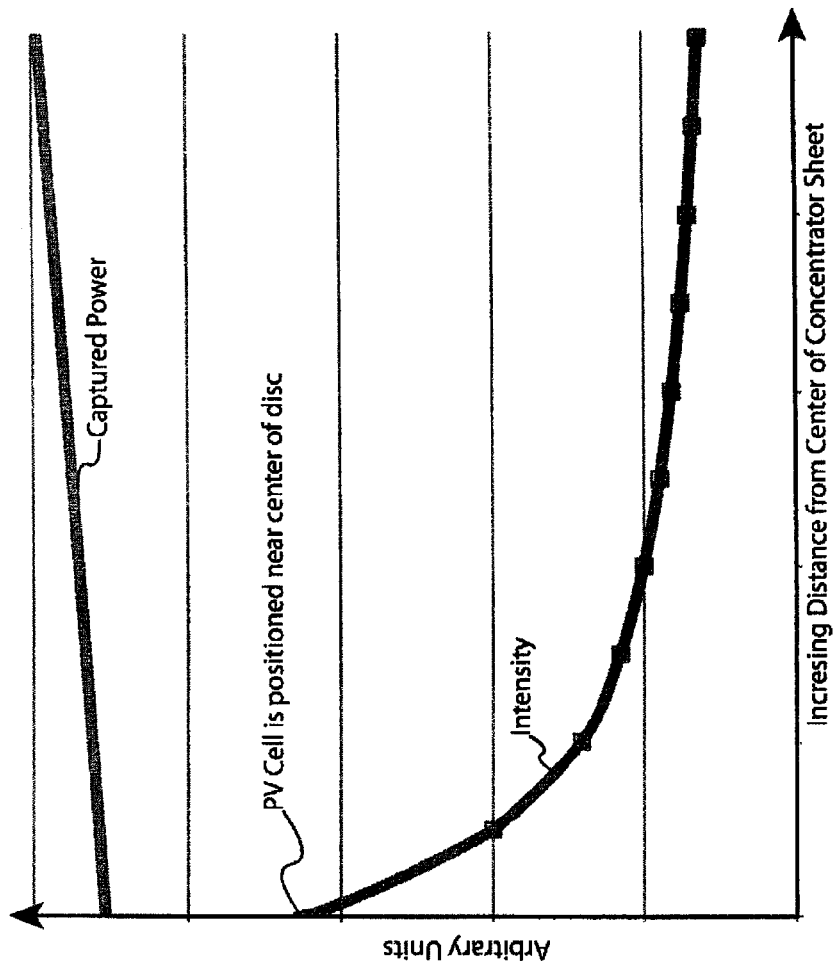
Figure 10E:
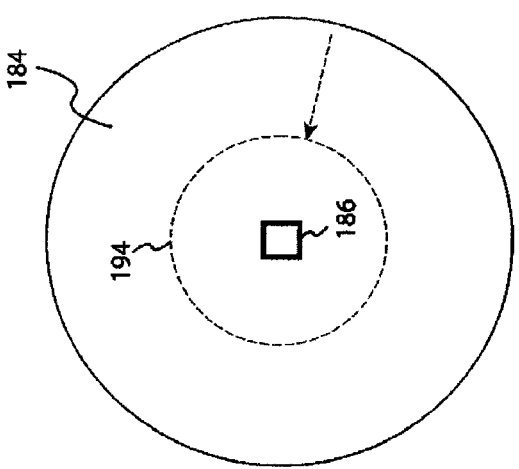

In FIG. 10C there is a luminescent layer 140 shown from above with a wave front of light 194 expanding outward in the layer. The graph in FIG. 10D shows the captured power and the intensity as the wave-front moves out from the center of the disk. The captured power increases as the wavefront of light expands over the whole disk. The intensity is shown to drop slightly over the same distance. Depending on the particular dyes and the amount of available sunlight, the intensity will either drop off, increase, or stay constant. FIG. 10E shows the concentrator sheet 184 with the same wave-front 194, having reflected off the rim of the disk and now collapsing on the center of the disk where the photovoltaic cells 186 are located. FIG. 10F shows the same graphs as FIG. 10D but in the concentrator sheet instead of the luminescent sheet. The captured power drops off slightly as the light converges to the center. This is due to scattering mechanisms and absorption in the bulk. No new sunlight is being captured in the concentrator layer. The intensity on the other hand increases dramatically as light collapses to the center of the disk. The cells are positioned at a point of high intensity, where the light is very concentrated.

The advantage of using bi-layer luminescent solar concentrators is that the highest concentration only occurs in the concentrator sheet away from the luminescent dye. The concentrator sheet can be made out of a resilient material like glass and the concentrations achievable could be very high, 1000, 2000, even as high as 5000 or 10000 suns. Such super high concentrations might damage dyes, but using a bi-layer design prevents the dye from experiencing the high flux associated with high concentration.

The bi-layer design is equally applicable to the elliptical designs, and the wedge shaped designs outlined above. The arrangement and means of coupling between the luminescent sheet and the concentrator sheet will be the subject of the FIGS. 11 through 14. All the FIGS. 11 through 14 show cross section views of disc shaped optics, but the concepts are equally applicable to the elliptical and wedge shaped optics described above.

FIG. 11 shows a luminescent sheet 140 positioned above a concentrator sheet 184 with an air gap 190 in between them. At the edges, the two are joined by a half-circular piece 195. An external reflector 196 is placed over this piece (it could also be mirror coated directly). Captured light 138 enters the half circle piece 195. Some of this light is redirected by total internal reflection such as at 198. Some light exits the half circle piece and reflects instead of the mirror. In any event all light is reflected 146 and converges on the photovoltaic cell in the concentrator sheet 184. Rather than having 4 cells in a square hole as before, a secondary optic 201 with a curved facet 202 is used to redirect the light down onto a cell. The facet has a curved mirror insert 204 with the same curvature (202 could also be mirror coated directly). The curved facet redirects light down onto a photovoltaic cell 206 that is lying in the same plane as the luminescent sheet and the concentrator sheet. The photovoltaic cell 206 sits on a circuit board 208 and is bonded to the secondary optic 201 using an optical bonding agent 209. Mirrored surfaced can be applied to the top surface of the circuit board 208 in order to prevent losses due to absorption by elements other than the photovoltaic cell 206, such as is indicated at 210. A bypass diode 212, typical of concentrator cells, is shown attached to the backside of the circuit board.

Figure 12A:
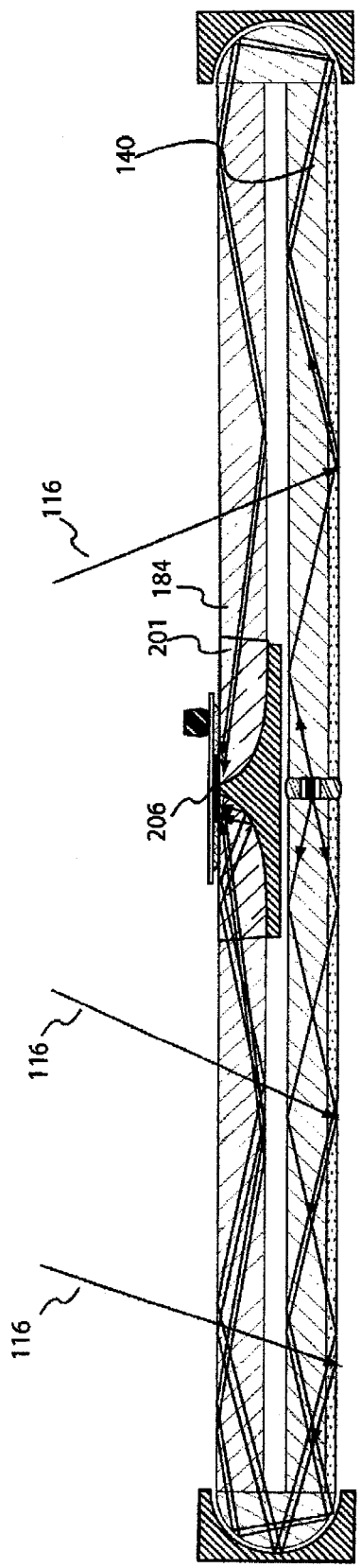
FIG. 12 shows that the embodiment from FIG. 11 illuminated is bifacial.
Figure 12C:
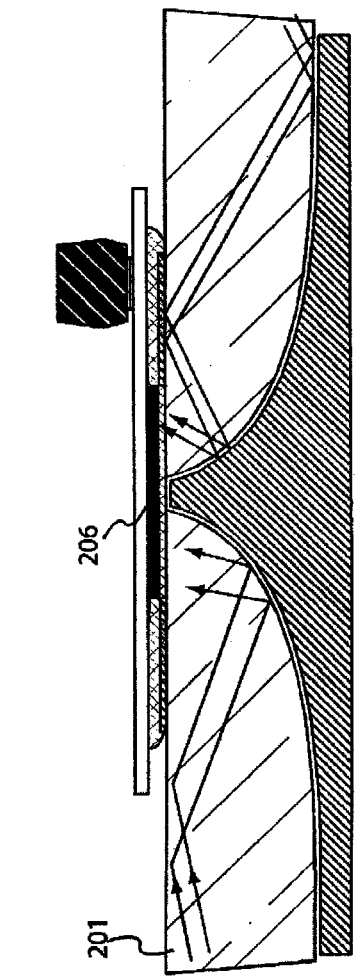
Figure 12B:
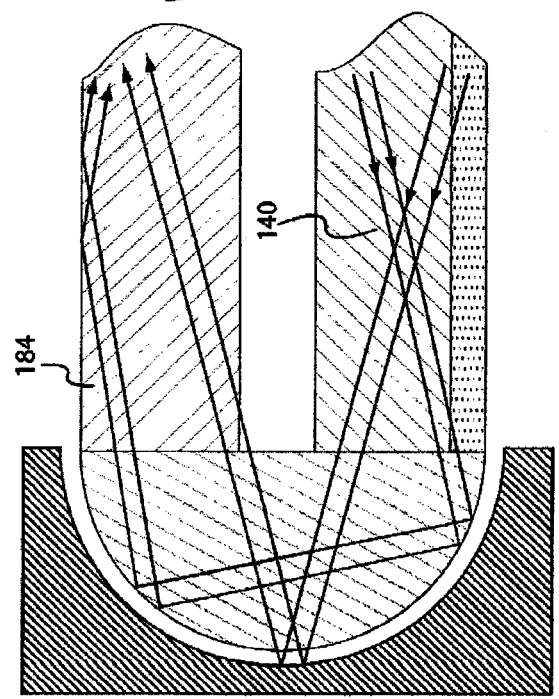

FIG. 12 shows the exact same system as FIG. 11 except that it is upside down. In other words, the sun is shinning on the opposite side of the device. Because the concentrator sheet is nothing more than a disc of glass with a collector in the center, light passes through undisturbed and can be collected by the luminescent sheet as before. There is some small Fresnel loss at the interfaces that could be mitigated by antireflection coatings. The device is bi-facial, it works with light from either side.

FIG. 13 shows the same system as FIG. 11 except that the secondary optic 201 has been flipped upside down so that the photovoltaic cell 206 sits above the concentrator sheet 184 rather than beneath it. This affords an opportunity to employ the same circuit board 208 which mounts the photovoltaic cell 206 to also mount the light source 126.

Figure 14A:
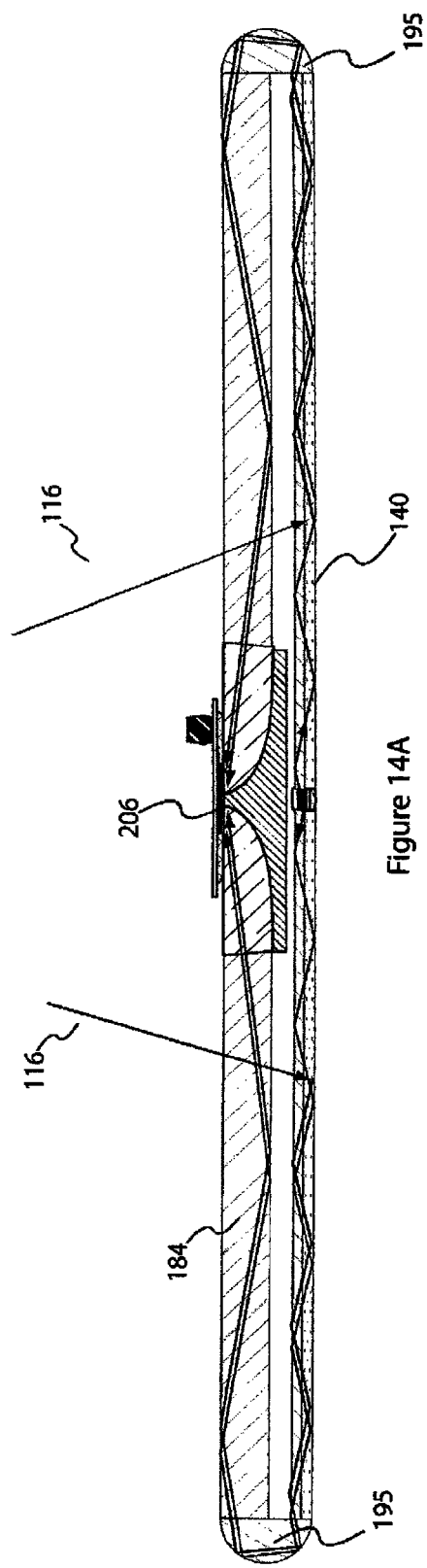
FIG. 14 shows a bi-layer stimulated emission luminescent light guide solar concentrator with a thin luminescent sheet.
Figure 14B:
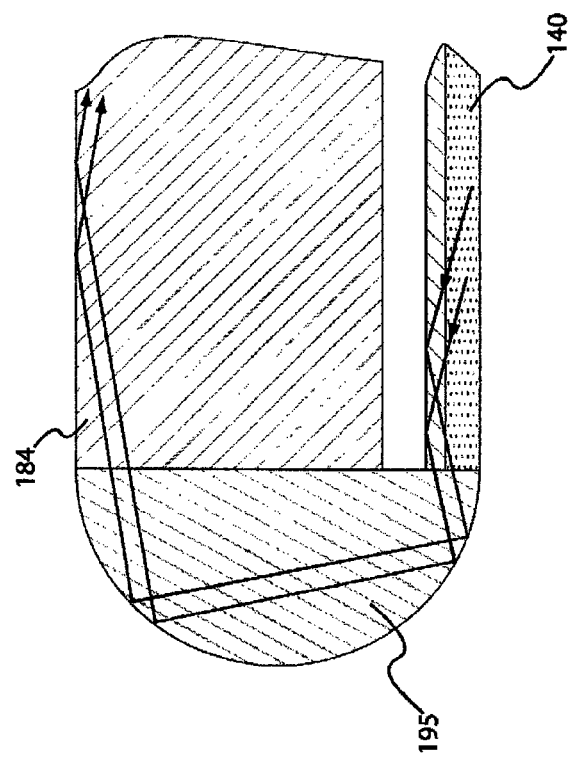

FIG. 14 shows a similar system to FIG. 12. It is, again, upside down demonstrating the bifacial nature of the optics. The change here is that the luminescent sheet 140 has been made very thin compared to the concentrator sheet 184. A thin luminescent sheet has two advantages. It maintains a relatively high flux in the luminescent sheet to keep the probability of stimulated emission high. It also removes the need for the mirror coated component 196. Light entering the half circle piece 195 will totally internally reflect and couple into the concentration sheet. Once in the concentrator sheet it will focus to the photovoltaic cell 206 as before.

Figure 15B:
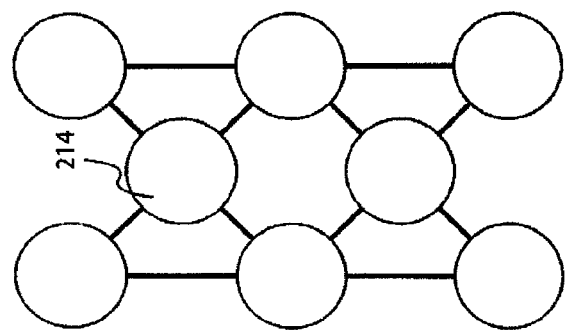
FIG. 15 shows a potential arrangement for stimulated emission luminescent light guide solar concentrator modules made of many separate optics.
Figure 15A:
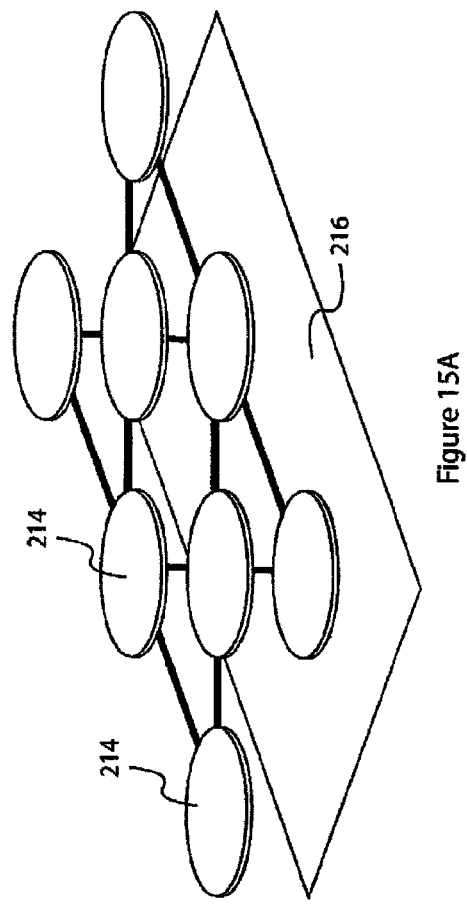
Figure 15C:
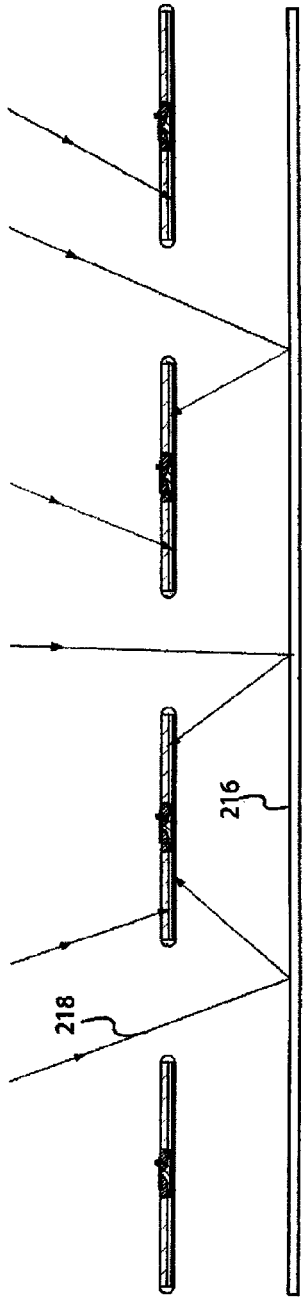

A module can be made of such stimulated emission luminescent solar concentrators by close packing the circular or elliptical, or wedge shaped elements into an array. The elements could also be made square in the way described above for optimal packing into rectangular modules. However, the bifacial nature of the optics can be taken advantage of to cover more area with less optics. FIG. 15 shows how the optics 214 can be arranged in a spaced out manner and positioned above a highly scattering reflector 216. Light 218 that hits sheet 216 will scatter back up and strike the optics 214 from the bottom. This can be done with the circular pieces, or any of the other shaped stimulated emission luminescent light guide solar concentrators discussed above.

Figure 16A:
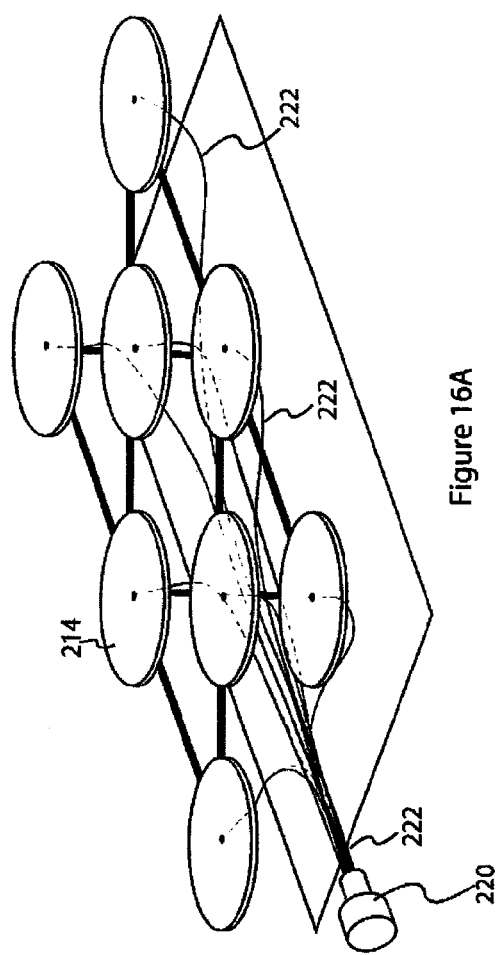
FIG. 16 shows how fiber optic cabling can be used to conduct light from a central light source to various optics in a module.
Figure 16B:
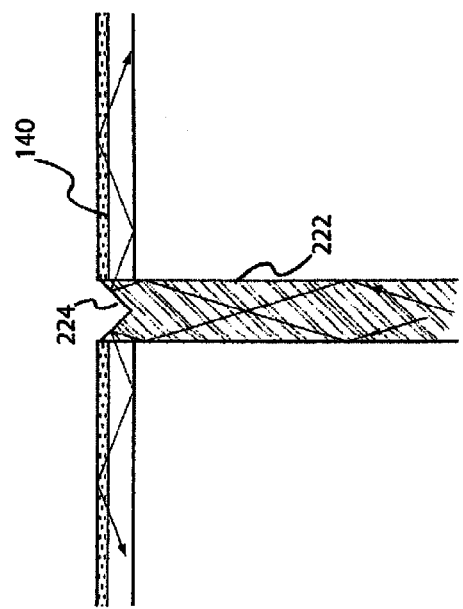

Up until now it has always been assumed that each light source would be a powered light source of some kind. FIG. 16 shows that a central light 220 can be used to feed light into fiber optic cables 222 which then take it to the luminescent sheets 140 of each optic. FIG. 16B shows how the end 224 of the fiber optic 222 can be structured with a simple inverted triangle shape in order to produce a side emitter. Light from a fiber optic can be used in the exact same way as light from a diode, and has the advantage of each module requiring only one, central light source rather than several. This might be less expensive and less failure prone.

Simulation:

A finite element model is created to model the collection of energy in the luminescent sheet. A simple, single dye system is modeled using a phosphorescent dye Pt-(TPBP) (a platinum-porphyrin derivative), with absorption maxima at 430 nm and 615 nm, and an emission peak at 772 nm. The circular sheet is divided into a series of annular rings, with a radial light source introduced at the center to act as the pump. A sheet thickness of 100 mm is used to maintain a high pump light intensity. In each ring the absorbed solar power is determined along with the probability of stimulated emission and reabsorption.

$$P_n = P_{n-1} + P_{solar,n} p_{stim} - P_{abs,n}$$

$P_n$-power in ring n
$P_{solar,n}$-absorbed solar power in ring n
$p_{stim}$-probability of stimulated emission
$P_{abs,n}$-power lost to reabsorption in ring n This first-order model gives a lower bound to the power that can be extracted from the luminescent sheet as it overestimates losses. The model considers photons that are absorbed by the dye to be irretrievably lost, while reabsorption actually leads to an excited dye molecule that once again relaxes via spontaneous or stimulated emission. There also exists an overestimate of lost energy to spontaneous emission, which occurs with probability $1-p_{stim}$. Spontaneously emitted photons that are emitted at large angles relative to the sheet are lost from the system, however those photons that remain in the sheet will eventually be reabsorbed, whereupon there is again a chance to undergo stimulated emission.

Figures 17A, 17B:
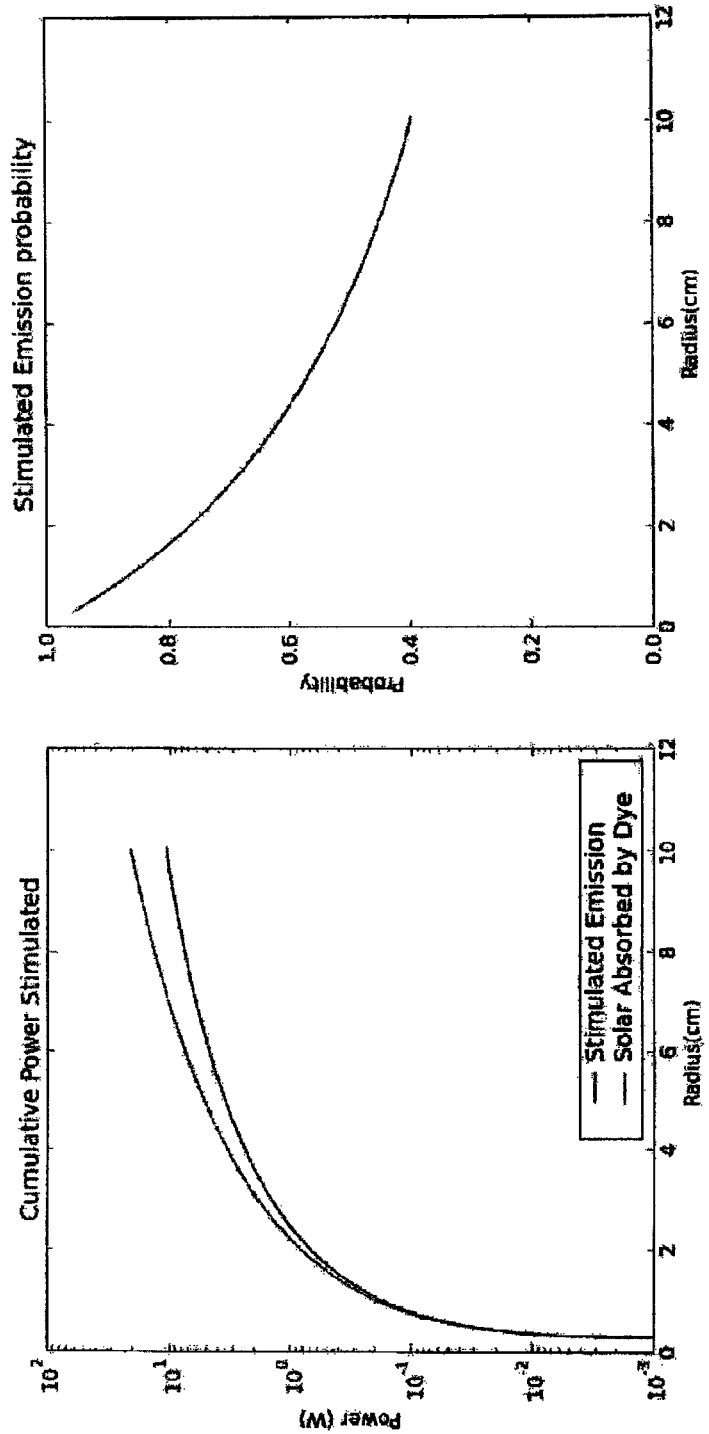
FIG. 17 shows some preliminary results from early computer modeling of the stimulated emission luminescent light guide solar concentrator.

FIG. 17a shows the cumulative absorbed solar power and power stimulated into the pump mode as a function of the radius, moving from the inner radius of 3.0 mm, out to the edge of the luminescent plate at 10 cm. FIG. 17b show the probability of stimulated emission as a function of the distance from the center with an initial pump intensity of 530 kW/cm2. The probability of stimulated emission falls with increasing distance from the center as the area illuminated by the pump light (from original pump and stimulated emission) increases with radius.

Different dies and geometries can be used in order to reduce the requirements for initial pump intensity power and to improve the sunlight capturing efficiency. However, the first order models demonstrate that it is possible to achieve a net gain in power by capturing sunlight in this way.

Figure 18:
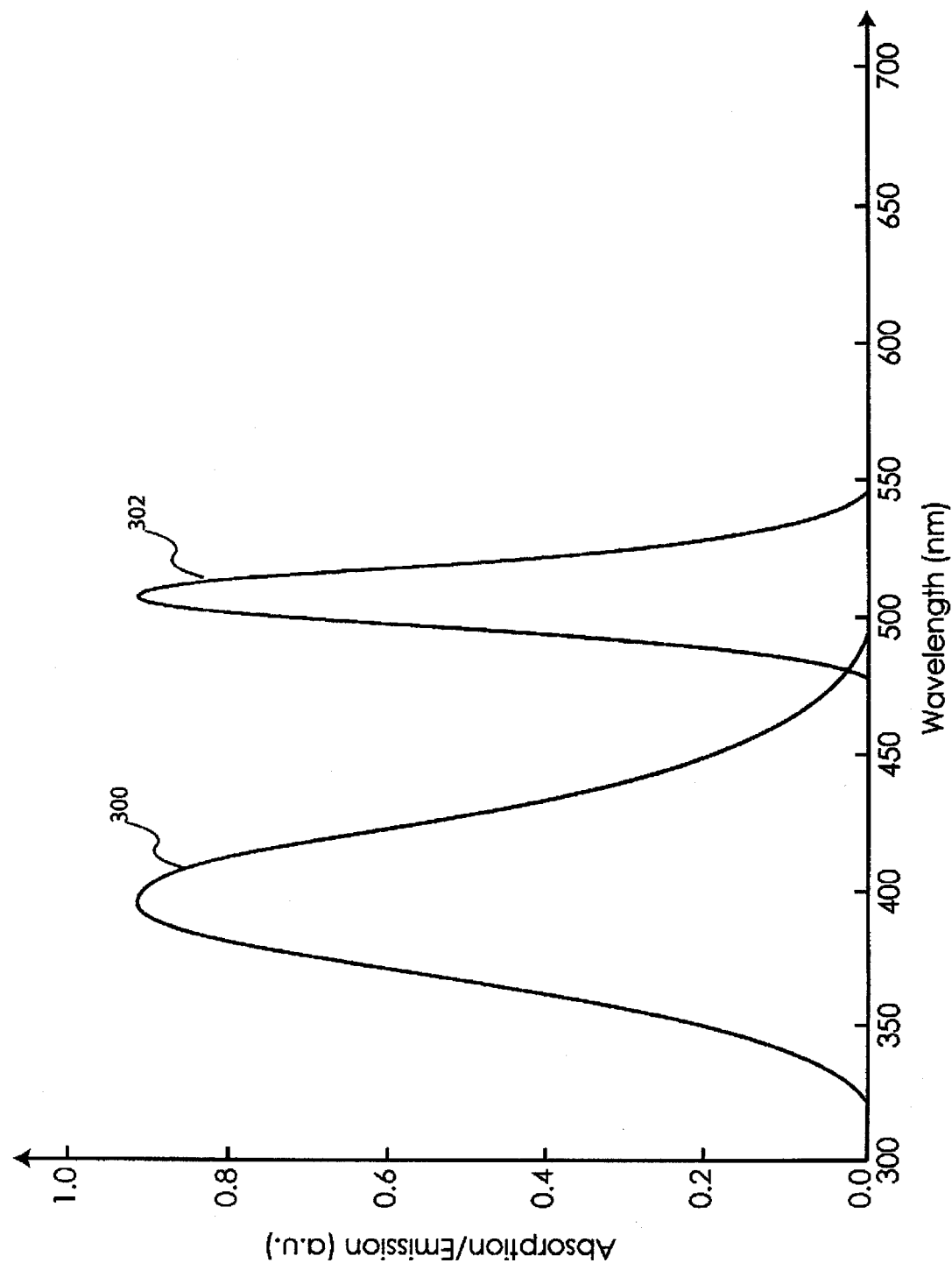
FIG. 18 shows an exemplary absorption and emission spectra from a luminescent material.

Returning to a discussion of various embodiments, higher efficiency can be gained for stimulated emission luminescent light guide solar concentrators if multiple luminescent materials are used, each of which reacts to a different portion of the solar spectrum. For example, FIG. 18 shows a single luminescent material with an absorption peak 300 and an emission peak 302. FIG. 19 shows three distinct sets of absorption peaks and emission peaks, each denoted by a different line style, which represent the luminescent characteristics of three different luminescent materials. The corresponding pairs are a first luminescent material the absorption peak 300 and emission peak 302, a second luminescent material the absorption peak 304 and emission peak 306, and a third luminescent material the absorption peak 308 and emission peak 310. In the Figure, the first luminescent materials tend to peak absorption at approximately 375 nanometers, the second material has a peak absorption at approximately 475 nanometers and the third material has a peak absorption at approximately 575 nanometers. These wavelengths and absorption emission curves are used for example only, and in fact any number of luminescent materials or dyes could be employed with absorption and emission spectra in the ultraviolet band, the visible spectra, the near infrared spectra or the infrared spectra or any combination. For clarity in the subsequent examples, three luminescent materials will be used in subsequent examples and they will be referred to as short wavelength, medium wavelength, and long wavelength materials to denote that each material acts on a different, but related, portion of the spectrum. These portions of the spectrum could be for example; blue, green, and red but other divisions of the spectrum are equally applicable.

Multiple layers of different luminescent material can be combined in a single device as shown in FIGS. 20*a* and 20*b*. Three layers, a short wavelength luminescent layer 312, a medium wavelength luminescent layer 314, and a long wavelength luminescent layer 316 are stacked, with cladding layers 318 separating them. Each layer is designed as an individual luminescent solar concentrator, with a light emitting device (320, 322, and 324) and a photovoltaic cell (326, 328, and 330). The light emitting devices, which can be light emitting diodes, are made so as to emit the spectrum necessary for their corresponding layer to stimulate emission. The photovoltaic cells are made so as to efficiently convert the portion of the spectra being emitted in their corresponding layer. The photovoltaic cells and the light emitting devices can be mounted onto substrates 332 and 334. The cladding has a lower index of refraction than the layers it separates and it prevents trapped light, such as light rays 336, 338, and 340, from leaving one layer and entering another. The cladding could be made, for example, out of fluorinated ethylene propylene or another low index material. The layers could be made from glass or polymers.

FIGS. 21*a*-21*d* show a three layer stimulated emission luminescent solar concentrator 342 which has an elliptical reflector 344. The layers are a short wavelength layer 312, a medium wavelength layer 314, and a long wavelength layer 316. The three light emitting devices (320, 322, and 324) and photovoltaic cells (326, 328, and 330) can either be aligned vertically, as shown in FIG. 21*a*, so that each is perfectly at the focus of the ellipse or they can be misaligned slightly as shown in FIG. 21*b*. Moving both the light emitting device and photovoltaic cells slightly away from the focus could provide more space for wiring and mounting to a substrate 346. A single substrate 346 can be used to mount all the light emitting devices and photovoltaic cells.

Figures 22A, 22B:
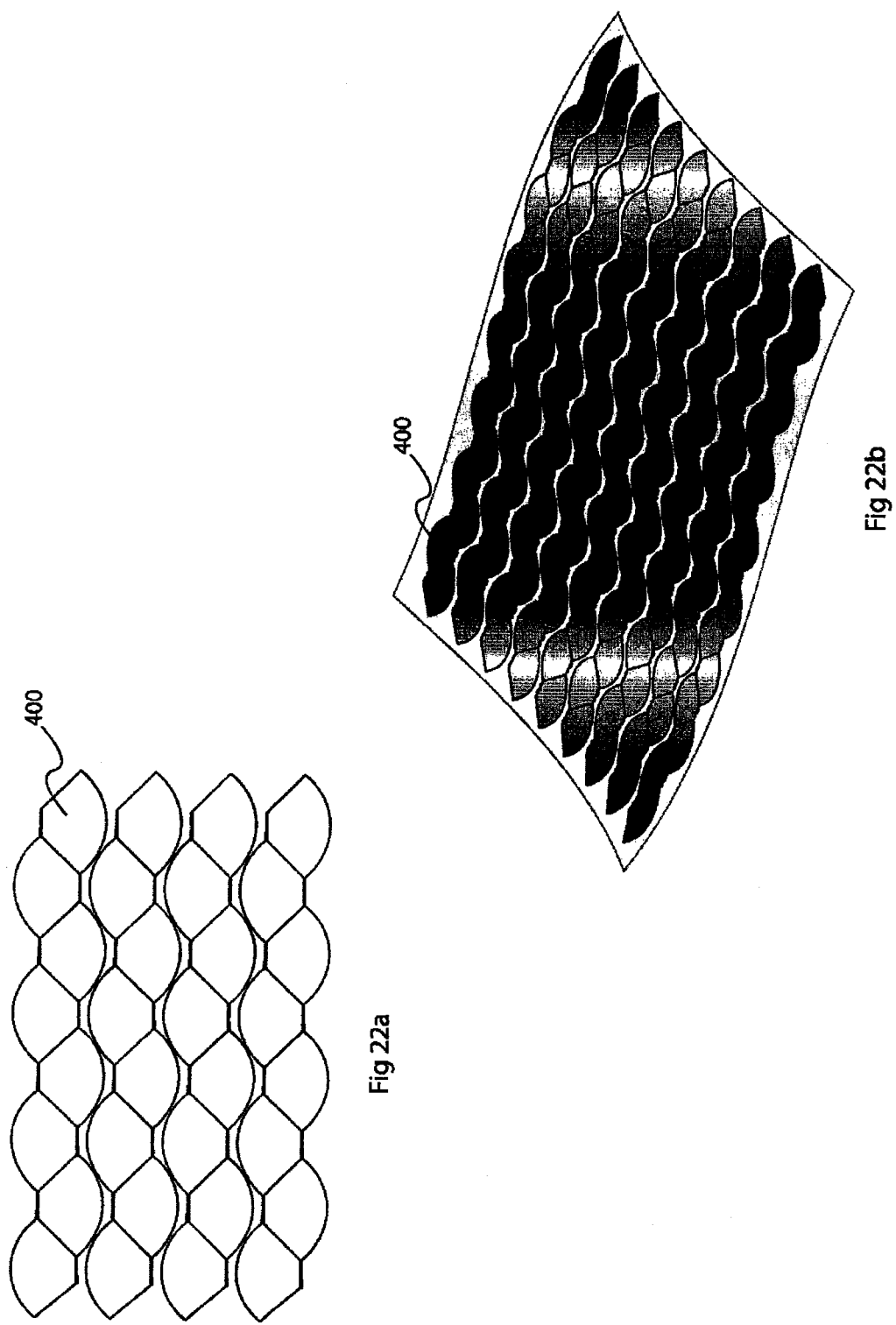
FIG. 22 shows a potential configuration of a module made of stimulated emission luminescent light guide solar concentrators.

FIG. 22 shows how the stimulated emission luminescent solar concentrator with a can be configured into a panel. Individual concentrators 400, each with a luminescent layer, a light source, and a photovoltaic cell, are arranged into an array as shown and packed tightly.

Modifications and improvements to the above-described embodiments of the present invention may become apparent to those skilled in the art. The foregoing description is intended to be exemplary rather than limiting. The scope of the present invention is therefore intended to be limited solely by the scope of the appended claims.

The invention claimed is:

1. A solar concentrator comprising:
   a light-transmissive sheet including:
      a plurality of luminescent particles capable of becoming excited by absorbing solar light within at least a first spectrum of absorption frequencies and, once excited, capable of being stimulated to emit light having a spectrum within at least a first spectrum of emission frequencies;
      a first light-guide; and
      at least one focus;
   at least one light source disposed substantially at at least one of the at least one focus for generating a pump light having a spectrum, a portion of which is within at least the first spectrum of emission frequencies, for stimulating at least one of the excited luminescent particles having absorbed solar light within the first spectrum of absorption frequencies such that when the pump light traveling in a first direction of travel stimulates the excited luminescent particles, the excited luminescent particles emit emitted light having a spectrum within the first spectrum of emission frequencies in the first direction of travel of the pump light; and
   a first reflector at an edge of the light-transmissive sheet so as to reflect the emitted light and the pump light toward a light collection area, the light collection area located substantially at one of the at least one focus; and
   the first light-guide for assisting in guiding the emitted light and the pump light via total internal reflection; and
   the emitted light and the pump light being concentrated and converging, at least in part within the first light-guide, toward the light collection area.

2. A method of concentrating solar light, comprising:
   (i) exposing at least one light-transmissive sheet having a plurality of luminescent particles, at least one light-guide and at least one focus, to solar light causing the luminescent particles to become excited by absorbing solar light within at least a first spectrum of absorption frequencies, the excited luminescent particles capable of being stimulated to emit emitted light having a spectrum within at least a first spectrum of emission frequencies;
   (ii) stimulating the excited luminescent particles via pump light of at least one frequency within at least the first spectrum of emission frequencies traveling in a first direction, to cause the excited luminescent particles to emit emitted light having a spectrum within the first spectrum of emission frequencies in the first direction of travel of the pump light, the pump light emanating substantially from at least one of the at least one focus,
   (iii) concentrating and converging the emitted light and the pump light via total internal reflection, at least in part in the at least one light-guide, toward a light collection area located substantially at least one of the at least one focus.

3. The solar concentrator of claim 1, wherein at least one of the first spectrum of absorption frequencies and the first spectrum of emission frequencies include at least one frequency that is not present in the other.

4. The solar concentrator of claim 1, wherein the light-transmissive sheet is generally of a shape selected from a group consisting of a circular disk, an elliptical disk, a section of an elliptical disk and a plurality of sections of elliptical disks forming a reflecting edge of many reflecting facets, and
   if the shape is a circular disk, the circular disk has one focus, and the light source and the light collection area are substantially at the focus;
   if the shape is an elliptical disk, the elliptical disk has two foci, and the light source is at one of the foci and the light collection area is at the other of the foci;
   if the shape is a section of an elliptical disk, the section of the elliptical disk has two foci on an edge thereof, and the light source is at one of the foci and the light collection area is at the other of the foci; and
   if the shape is a plurality of sections of elliptical disks, each of the plurality of sections of elliptical disks has two foci in common with each of the others of the plurality of sections of elliptical disks, and the light source is at one of the common foci and the light collection area is at the other of the common foci.

5. The solar concentrator of claim 1, further comprising at least one secondary optic adjacent at least one of the light collection area and the at least one light source.

6. The solar concentrator of claim 5, wherein the at least one secondary optic is made of a different material than adjacent materials.

7. The solar concentrator of claim 1, further comprising a second light guide optically coupled to the light-transmissive sheet, the second light-guide for guiding at least light received from the light-transmissive sheet to the light collection area; the light-transmissive sheet and the second light-guide being stacked one upon the other and separated from one another by a first material having a lower index of refraction than that of both the light-transmissive sheet and the second light-guide; and a macroscopic direction of travel of light within the light-transmissive sheet and a macroscopic direction of travel of light within the second light-guide being generally opposite one another.

8. The solar concentrator of claim 1, wherein the light-transmissive sheet comprises a transparent substrate and the luminescent particles are a luminescent dye impregnated in the substrate.

9. The solar concentrator of claim 1, the luminescent particles being within a luminescent layer adjacent to and optically coupled with the first light-guide.

10. A solar energy collector comprising a solar concentrator of claim 1, and at least one photovoltaic cell disposed at the light collection area of the concentrator.

11. The solar energy collector of claim 10, wherein the at least one light source and the at least one photovoltaic cell are disposed on a single circuit board.

12. The solar energy collector of claim 10, wherein the at least one light source is powered by energy from the at least one photovoltaic cell.

13. A solar energy collector comprising:
at least two solar concentrators of claim 1, each concentrator being adjacent to and optically coupled with the other concentrators, the luminescent particles of each of the concentrators being capable of becoming excited by absorbing solar light within a spectrum of absorption that includes, at least in part, different frequencies from the other concentrators and being capable of being stimulated to emit light of at least one frequency within a spectrum of emission frequencies that is, at least in part, different from the other concentrators; and
at least one photovoltaic cell disposed at each of the light collection areas of the concentrators.

14. The solar energy collector of claim 13, wherein at least two of the light-transmissive sheets of the solar concentrators are separated from one another by a second material having a lower index of refraction than that of the at least two light-transmissive sheets.

15. A solar energy collector assembly comprising a plurality of solar concentrators of claim 1; at least two light sources of the concentrators being in optical communication with a central light source such that the at least two light sources emit pump light generated by the central light source.

16. The solar concentrator of claim 1 wherein the first reflector is a mirror.

* * * * *